US011054174B2

(12) United States Patent
Hwang et al.

(10) Patent No.: US 11,054,174 B2
(45) Date of Patent: *Jul. 6, 2021

(54) SEMICONDUCTOR PROCESS BY-PRODUCT COLLECTING DEVICE

(71) Applicant: MILAEBO CO., LTD., Pyeongtaek-si (KR)

(72) Inventors: Kyu Hyun Hwang, Osan-si (KR); Nak Jin Choi, Osan-si (KR); Tae Yeon Kim, Gangwon-do (KR); Kyung Tae Kim, Suwon-si (KR); Che Hoo Cho, Seongnam-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 305 days.

This patent is subject to a terminal disclaimer.

(21) Appl. No.: 16/243,570

(22) Filed: Jan. 9, 2019

(65) Prior Publication Data
US 2020/0217559 A1    Jul. 9, 2020

(51) Int. Cl.
*F24H 3/00*    (2006.01)
*H01L 21/67*    (2006.01)
(52) U.S. Cl.
CPC ......... *F24H 3/00* (2013.01); *H01L 21/67017* (2013.01)
(58) Field of Classification Search
CPC ........ B01D 45/00; B01D 45/08; B01D 51/02; C23C 16/4412; F24H 3/00; H01L 21/67;

(Continued)

(56) References Cited

U.S. PATENT DOCUMENTS 5,820,641 A * 10/1998 Gu ....................... B01D 5/0036
55/434.4
6,197,119 B1 * 3/2001 Dozoretz ............. B01D 5/0036
118/715

(Continued)

FOREIGN PATENT DOCUMENTS

KR    10-2006-0085357 A    7/2006
KR       10-0647725 B1    11/2006

(Continued)

OTHER PUBLICATIONS

Korean Office Action dated Dec. 19, 2017.

*Primary Examiner* — Minh Chau T Pham
(74) *Attorney, Agent, or Firm* — Rabin & Berdo, P.C.

(57) ABSTRACT

Disclosed is an apparatus for collecting a by-product in a semiconductor process, the apparatus including: a housing; a heater plate; a heater power supply unit; first and second upper horizontal brackets collecting a part of a by-product in a powder form; a by-product collecting tower allowing the exhaust gas to pass vertically and collecting a part of the by-product in a powder form; a lower horizontal bracket guiding the exhaust gas toward a window and collecting a part of the by-product in a powder form; the window blocking the powder form by-product from introducing toward a gas collecting and discharging port and guiding the exhaust gas thereto; and the gas collecting and discharging port. Accordingly, the apparatus can increase capacity of collecting by-products with a simple structure, thereby extending a replacement period of the apparatus and collect a large amount of by-products efficiently over a long period of time.

20 Claims, 15 Drawing Sheets

(58) Field of Classification Search
CPC ......... H01L 21/67011; H01L 21/67017; H01L 21/67098
USPC ........... 55/385.1, 434.4; 118/715; 156/345.1; 165/61; 438/758
See application file for complete search history.

(56) References Cited

U.S. PATENT DOCUMENTS

| | | | |
|---|---|---|---|
| 10,801,107 B2* | 10/2020 | Cho | C23C 16/4412 |
| 2001/0017080 A1* | 8/2001 | Dozoretz | B01D 5/0036 |
| | | | 96/108 |
| 2008/0166881 A1* | 7/2008 | Taniyama | H01L 21/3185 |
| | | | 438/758 |
| 2010/0012292 A1* | 1/2010 | Yamazaki | H01L 21/67017 |
| | | | 165/61 |
| 2020/0131641 A1* | 4/2020 | Hsu | C23C 18/1283 |
| 2020/0321226 A1* | 10/2020 | Cho | B01D 51/02 |

FOREIGN PATENT DOCUMENTS

| | | |
|---|---|---|
| KR | 10-0676927 B1 | 2/2007 |
| KR | 10-0834492 B1 | 6/2008 |
| KR | 10-0862684 B1 | 10/2008 |
| KR | 10-1024504 B1 | 3/2011 |
| KR | 10-1057086 B1 | 8/2011 |
| KR | 10-1447629 B1 | 10/2014 |
| KR | 10-2015-0080195 A | 7/2015 |

* cited by examiner

SEMICONDUCTOR PROCESS BY-PRODUCT COLLECTING DEVICE

SPECIFIC REFERENCE TO A GRACE PERIOD INVENTOR DISCLOSURE

This invention has been published as Korean Registration No. 10-1865337 registered on May 31, 2018.

BACKGROUND OF THE INVENTION

Field of the Invention

The present invention relates to an apparatus for collecting a by-product in a semiconductor process. More particularly, the present invention relates to an apparatus for collecting a by-product in a semiconductor process, the apparatus efficiently collecting a large amount of by-products contained in gas exhausted from a process chamber in a semiconductor device manufacturing process and handling the by-products safely.

Description of the Related Art

Generally, a semiconductor manufacturing process is roughly classified into a fabrication process and an assembly process. The fabrication process is a process for manufacturing a chip in which a thin film is deposited on a wafer in various process chambers and a process of selectively etching the deposited thin film is repeatedly performed to process a predetermined pattern. The assembly process is a process of separating the chip manufactured in the fabrication process, and then joining the chip with the lead frame to assemble into the finished product.

Here, a process of depositing a thin film on the wafer or etching a thin film deposited on the wafer is performed at a high temperature in a process chamber, by using hazardous gases such as silane, arsine, boron chloride, and process gases such as hydrogen gas. During the process, a large amount of various ignitable gases and hazardous gases containing corrosive foreign substances and toxic components are produced in the process chamber.

Therefore, in semiconductor manufacturing equipment, a scrubber for purifying an exhaust gas discharged from the process chamber and discharging the exhaust gas to the atmosphere is installed at a rear end of a vacuum pump, which brings the process chamber into a vacuum state.

The exhaust gas discharged from the process chamber is solidified and changes into powder when coming into contact with the atmosphere or when the ambient temperature is low. However, the powder is adhered to an exhaust line such that an exhaust pressure is raised. In addition, when the powder is introduced into the vacuum pump, the powder causes a failure of the vacuum pump and causes the exhaust gas to flow backward, thereby contaminating a wafer in the process chamber.

In order to solve the above problems, as illustrated in FIG. 13, a powder trap device is provided between a process chamber 1 and a vacuum pump 3 and catching the exhaust gas discharged from the process chamber 1 in a powder state.

As shown in FIG. 13, the process chamber 1 and the vacuum pump 3 are connected to each other through a pumping line 2, and a trap tube 7 trapping and accumulating by-products produced in the process chamber 1 in a powder form is provided at a position branched from the pumping line 2.

In such a conventional powder trap device, unreacted gas produced during the deposition or etching of the thin film in the process chamber 1 is introduced toward the pumping line 2 having a relatively low temperature as compared with the process chamber 1. Thus, the gas is solidified into powder 9 and accumulated in the trap tube 7, which is provided at a position branched from the pumping line 2.

Accordingly, in order to solve the above-mentioned problems of the related art, the applicant has developed by-product collecting apparatuses of a semiconductor apparatus and disclosed the same in Korean Patent Nos. 10-0647725 and 10-0676927.

However, the by-product collecting apparatuses have the following problems.

First, because a collection area (space) of a trap tube filled with powder is very small, the number of stoppages of an operation of the process chamber is increased, leading to an increase in waiting time of the process chamber for removing the powder accumulated in the trap tube. As a result, a turnaround time (TAT) is increased, which causes a decrease in productivity and an increase in product price, and shortens a trap tube cleaning cycle.

Second, a thin film deposition method is changed from chemical vapor deposition (CVD) to atomic layer deposition (ALD) due to the integration of semiconductor process, and precursors used are diversified and source usage increases. This increases the amount of unreacted by-products and requires a trap capable of collecting a large amount of by-products. A conventional low-capacity collecting apparatus has problems due to an increase in the number of stoppages of the operation of the process chamber for cleaning, and thus there is a demand for a large-capacity by-product collecting apparatus, which is capable of increasing a cleaning cycle.

However, when simply enlarging the by-product collecting apparatuses disclosed in the above-mentioned Korean Patent Nos. 10-0647725 and 10-0676927, there are problems in that it is difficult to manufacture a spiral plate, leading to an increase in manufacturing cost. In addition, a double housing is applied in the apparatus due to a housing coolant and thus the manufacturing cost of the tube increases as a tube, which is a material of the cylindrical housing, becomes larger. Furthermore, an actual collection space of the apparatus is reduced due to the complicated inner structure compared to the total area.

Documents of Related Art (Patent Document 0001) Korean Patent No. 10-0647725, registered on Nov. 13, 2006;
(Patent Document 0002) Korean Patent No. 10-0676927, registered on Jan. 25, 2007;
(Patent Document 0003) Korean Patent No. 10-1024504, issued on Mar. 17, 2011; and
(Patent Document 0004) Korean Patent No. 10-1057086, registered on Aug. 9, 2011)

SUMMARY OF THE INVENTION

Accordingly, the present invention has been made keeping in mind the above problems occurring in the related art, and the present invention is intended to propose an apparatus for collecting a by-product in a semiconductor process, the apparatus including: a housing formed into a relatively large volume rectangle in which upper and lower openings are closed by an upper plate and a lower plate respectively provided with a gas inlet and a gas outlet; a heater plate provided on the bottom surface of the upper plate to heat and distribute the exhaust gas evenly; a first upper horizontal bracket and a second upper horizontal bracket provided at an upper portion of the housing; a by-product collecting tower provided below the second upper horizontal bracket, having a structure in which multiple first and second directional vertical plates having multiple horizontal gas passing holes are assembled in a lattice form in a manner that intersects each other in a direction of 90 degree angles or having a structure whose four sides are stepped in which multiple first and second directional vertical plates having multiple horizontal gas passing holes and cut at different heights are assembled in a lattice form, allowing the exhaust gas introduced through the second upper horizontal bracket in the vertical direction or introduced through the inner space of the housing in a lateral direction to pass in the vertical direction, and collecting a part of the by-product in a powder form; a lower horizontal bracket provided below the by-product collecting tower; a window provided below the lower horizontal bracket and having a rectangular frame shape having multiple gas suction holes; and a gas collecting and discharging port provided with an exhaust gas suction opening opened in four directions and disposed between the inside of the window and a gas discharge opening such that the apparatus of the present invention increases capacity of collecting a by-product greatly with a simple structure, thereby extending a replacement period of the apparatus in a semiconductor manufacturing apparatus. In addition, the apparatus collects a large amount of by-products quickly and efficiently over a long period of time.

In order to achieve the above object, there is provided an apparatus for collecting a by-product in a semiconductor process, the apparatus provided on a line between a process chamber and a vacuum pump to collect a by-product in an exhaust gas, which is produced in the process chamber, the apparatus including: a housing provided with a gas inlet and a gas outlet respectively provided on an upper plate and a lower plate, which are detachably coupled to upper and lower openings respectively, and configured with a passage through which gas exhausted from the process chamber flows; a heater plate made of ceramic or inconel material, provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the energy evenly inside the housing; a heater power supply unit provided at a side of the upper plate of the housing to supply a power to the heater plate; a first upper horizontal bracket having multiple by-product collecting members, which are fixed on an upper surface of a quadrangular plate having a relatively large-diameter vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form; a second upper horizontal bracket having multiple minute gas passing holes, which have a relatively small diameter and is formed at an outer perimeter of a relatively large-area vertical mass gas passing opening formed at the center thereof, disposed spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form; a by-product collecting tower having a structure in which multiple first and second directional vertical plates having multiple horizontal gas passing holes are assembled in a lattice form in a manner that intersects each other in a direction of 90 degree angles, disposed between the second upper horizontal bracket and a lower horizontal bracket to allow the exhaust gas introduced through the second upper horizontal bracket in the vertical direction or introduced through the inner space of the housing in a lateral direction to pass in the vertical direction and collecting a part of the by-product in a powder form; the lower horizontal bracket having multiple gas holes spaced a predetermined distance apart from each other, provided fixedly below a lower surface of the by-product collecting tower in the horizontal direction, guiding the exhaust gas vertically introduced through the by-product collecting tower toward a window, and collecting a part of the by-product contained in the exhaust gas in a powder form; the window having a structure in which five rectangular plates having multiple gas suction holes are assembled into a rectangular shape with a bottom surface opened, configured in which the window is provided fixedly to be spaced a predetermined distance from the bottom of the lower horizontal bracket and in which a bottom surface thereof is spaced a predetermined distance apart from an upper surface of the lower plate of the housing by the multiple supporters, and blocking the by-product that passes through the by-product collecting tower and the lower horizontal bracket or flows in the lateral direction through the inner space of the housing and then is converted into the powder form from directly introducing toward a gas collecting and discharging port and guiding only the exhaust gas toward the gas collecting and discharging port; and the gas collecting and discharging port provided at an upper portion thereof with an exhaust gas suction opening having "+" shape which is opened in four directions, disposed vertically between the inside of the window and a gas discharge opening provided on the lower plate of the housing, and collecting the exhaust gas introduced from upper, front, rear, and sides through the gas suction holes of the window and through the bottom of the window, which is opened, to discharge the exhaust gas outside.

According to another aspect of the present invention, there is provided an apparatus for collecting a by-product in a semiconductor process, the apparatus provided on a line between a process chamber and a vacuum pump to collect a by-product in an exhaust gas, which is produced in the process chamber, the apparatus including: a housing provided with a gas inlet and a gas outlet respectively provided on an upper plate and a lower plate, which are detachably coupled to upper and lower openings respectively, and configured with a passage through which gas exhausted from the process chamber flows; a heater plate made of ceramic or inconel material, provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the energy evenly inside the housing; a heater power supply unit provided at a side of the upper plate of the housing to supply a power to the heater plate; a first upper horizontal bracket having multiple by-product collecting members, which are fixed on an upper surface of a quadrangular plate having a relatively large-diameter vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form; a second upper horizontal bracket having multiple minute gas passing holes, which have a relatively small diameter and is formed at an outer perimeter of a relatively large-area vertical mass gas passing opening formed at the center thereof, disposed spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form; a by-product collecting tower having a rectangular tower shape whose four sides are stepped in which multiple first and second directional vertical plates having multiple horizontal gas passing holes and cut at different heights are assembled in a lattice form, disposed between the second upper horizontal bracket and a lower horizontal bracket, allowing a part of the exhaust gas introduced through the second upper horizontal bracket to pass in the vertical direction and allowing the remaining exhaust gas to flow on the four sides in stepped manner or flow slantingly along the four sides, and collecting a part of the by-product in a powder form; the lower horizontal bracket having multiple gas holes spaced a predetermined distance apart from each other, provided fixedly below a lower surface of the by-product collecting tower in the horizontal direction, guiding the exhaust gas vertically introduced through the by-product collecting tower toward a window, and collecting a part of the by-product contained in the exhaust gas in a powder form; the window having a structure in which five rectangular plates having multiple gas suction holes are assembled into a rectangular shape with a bottom surface opened, configured in which the window is provided fixedly to be spaced a predetermined distance from the bottom of the lower horizontal bracket and in which a bottom surface thereof is spaced a predetermined distance apart from an upper surface of the lower plate of the housing by the multiple supporters, and blocking the by-product that passes through the by-product collecting tower and the lower horizontal bracket or flows in the lateral direction through the inner space of the housing and then is converted into the powder form from directly introducing toward a gas collecting and discharging port and guiding only the exhaust gas toward the gas collecting and discharging port; and the gas collecting and discharging port provided at an upper portion thereof with an exhaust gas suction opening having "+" shape which is opened in four directions, disposed vertically between the inside of the window and a gas discharge opening provided on the lower plate of the housing, and collecting the exhaust gas introduced from upper, front, rear, and sides through the gas suction holes of the window and through the bottom of the window, which is opened, to discharge the exhaust gas outside.

In addition, the apparatus of the embodiments may further include: multiple minute gas passing holes, which have a diameter smaller than that of the vertical mass gas passing opening provided on the center of the quadrangular plate, on the quadrangular plate of the first upper horizontal bracket such that a part of the exhaust gas flowing horizontally along the upper surface of the quadrangular plate of the first upper horizontal bracket flows toward the second upper horizontal bracket and the by-product collecting tower through the multiple minute gas passing holes.

In addition, the by-product collecting members disposed on an upper surface of the first upper horizontal bracket may include: multiple gas flow guiding plates radially arranged in a vertically erected state; and multiple by-product collecting plates crossed at right angles to the gas flow guide plates while being spaced at a predetermined distance from one another.

In addition, in the embodiments, among the multiple first and second directional vertical plates constituting the by-product collecting tower, first and second directional vertical plates located on the inner side may be configured to have heights approximately ½ or ⅓ of those located on the outer side of the four sides such that a powder collecting portion having a volume of ½ or ⅓ of a total internal volume is formed in an upper portion of the inside of the by-product collecting tower.

In addition, the apparatus of the embodiments may further include: an inclined exhaust gas guiding pipe inclined downwardly at a predetermined angle at an end of the exhaust gas suction opening disposed to face four surfaces of the housing in order to suck, collect, and discharge the exhaust gas passing through the window and the exhaust gas guided to a lower portion of the housing.

Here, an inclined angle of the inclined exhaust gas guiding pipe provided in the exhaust gas suction opening of the gas collecting and discharging port may be in a range of 10 degree angles to 20 degree angles.

In addition, the apparatus may further include: a cooling pipe through which a coolant flows embedded inside the upper plate of the housing; and a coolant inlet and a coolant outlet connected to both ends of the cooling pipe respectively and provided on an upper surface of the upper plate the upper plate is prevented from being overheated due to heat produced from the heater plate, whereby a sealing or a gasket provided between upper surface of the housing and the bottom surface of the upper plate is prevented from being damaged and the by-product powder is collected on the bottom surface of the upper plate.

In addition, the apparatus may further include: multiple vortex generating plates installed at a predetermined height from an inner wall of the housing in the vertical direction in order to allow the exhaust gas passing through the inside of the housing to vortex.

Here, the vortex generating plates may be formed to have a side cross-sectional surface among shapes of "–", "", "", "", and "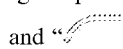".

In addition, the apparatus may further include: multiple legs each having a height adjusting bolt/support and provided at a lower end of the bottom surface of the lower plate of the housing in the vertical direction.

In addition, the apparatus may further include: multiple housing deformation preventing rings provided on an outer surface of the housing while keeping a predetermined distance to each other on the vertical direction, in order to prevent the shape of the housing having a predetermined volume from being deformed by a suction force generated in operation of a vacuum pump.

Furthermore, the apparatus may further include: a pair of handles on front and rear surfaces, or both side surfaces of the housing.

As described above, there is provided the apparatus for collecting a by-product in a semiconductor process, the apparatus including: the housing formed into a relatively large volume rectangle in which the upper and lower openings are closed by the upper plate and the lower plate respectively provided with the gas inlet and the gas outlet; the heater plate provided on the bottom surface of the upper plate to heat and distribute the exhaust gas evenly; the first upper horizontal bracket and the second upper horizontal bracket provided at the upper portion of the housing; the by-product collecting tower provided below the second upper horizontal bracket, having the structure in which multiple first and second directional vertical plates having multiple horizontal gas passing holes are assembled in the lattice form in a manner that intersects each other in a direction of 90 degree angles or having the structure whose four sides are stepped in which multiple first and second directional vertical plates having multiple horizontal gas passing holes and cut at different heights are assembled in the lattice form, allowing the exhaust gas introduced through the second upper horizontal bracket in the vertical direction or introduced through the inner space of the housing in the lateral direction to pass in the vertical direction, and collecting a part of the by-product in a powder form; the lower horizontal bracket provided below the by-product collecting tower; the window provided below the lower horizontal bracket and having the rectangular frame shape having multiple gas suction holes; and the gas collecting and discharging port provided with the exhaust gas suction opening opened in four directions and disposed between the inside of the window and the gas discharge opening, whereby the apparatus of the present invention can increase capacity of collecting a by-product greatly with a simple structure, thereby extending a replacement period of the apparatus in a semiconductor manufacturing apparatus. In addition, the apparatus can collect a large amount of by-products quickly and efficiently over a long period of time. As a result, the efficiency of collecting various kinds of by-products produced in semiconductor manufacturing, and the productivity and reliability of semiconductor manufacturing can be greatly improved.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, exemplary embodiments of the present invention will be described in detail with reference to the accompanying drawings.

However, in the following description, it is to be noted that, when the functions of conventional elements and the detailed description of elements related with the present invention may make the gist of the present invention unclear, a detailed description of those elements will be omitted.

Figure 1:
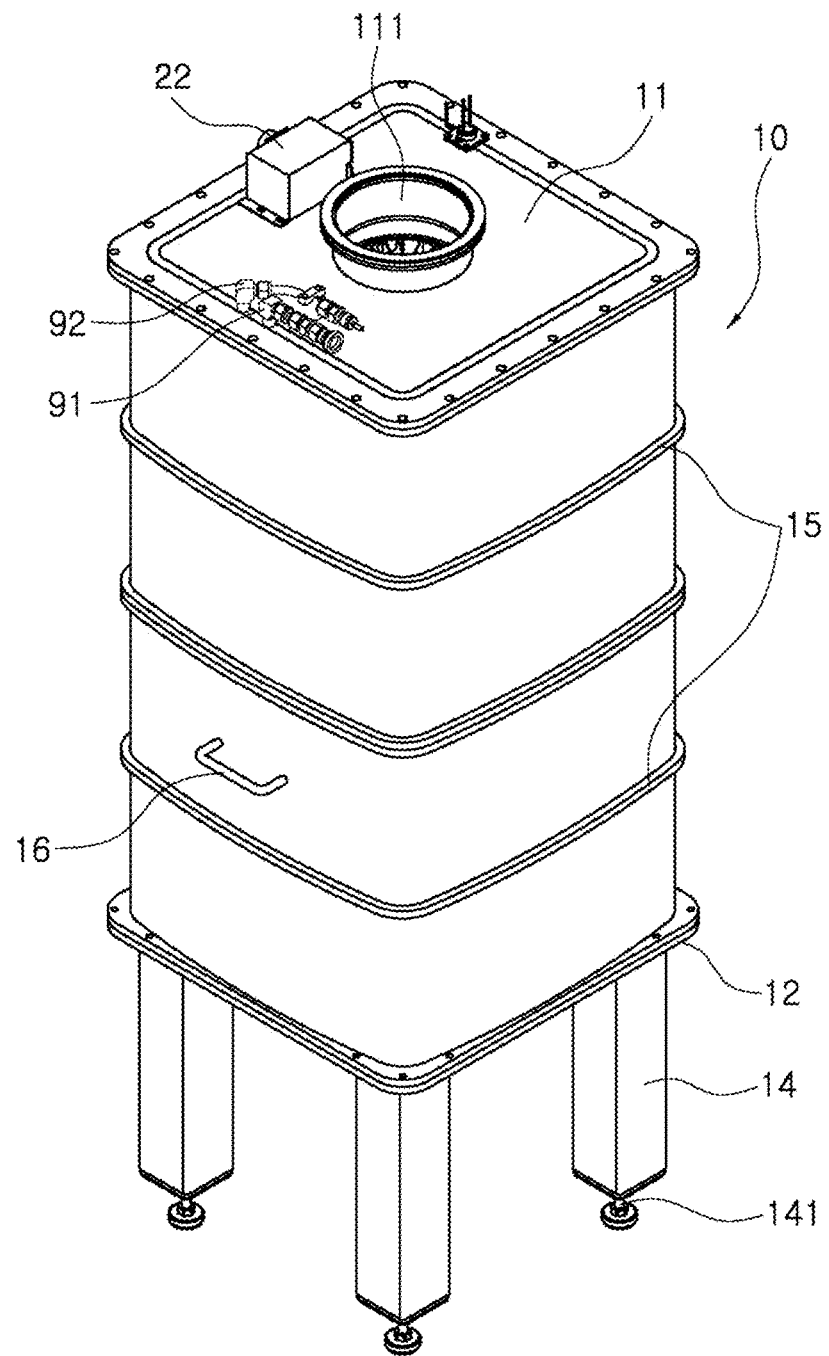
FIG. 1 is a perspective view of an apparatus for collecting a by-product in a semiconductor process according to a first or second embodiment of the present invention.
Figure 2:
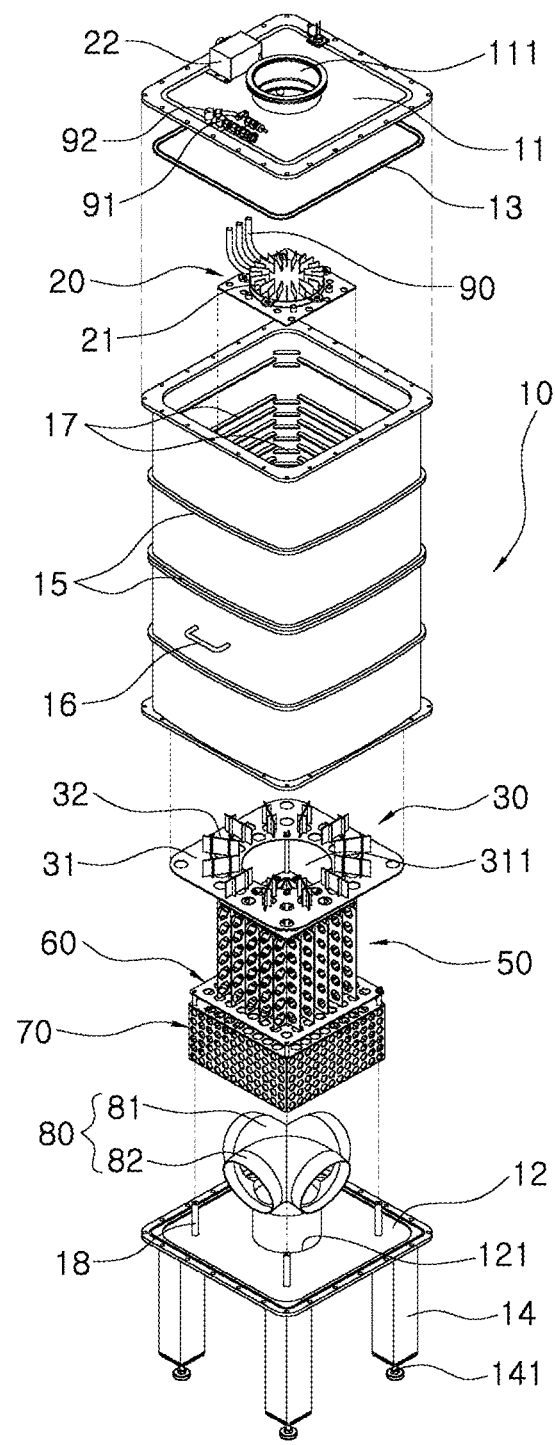
FIG. 2 is an exploded-perspective view illustrating the apparatus for collecting a by-product in a semiconductor process according to the first embodiment of the present invention.
Figure 3:
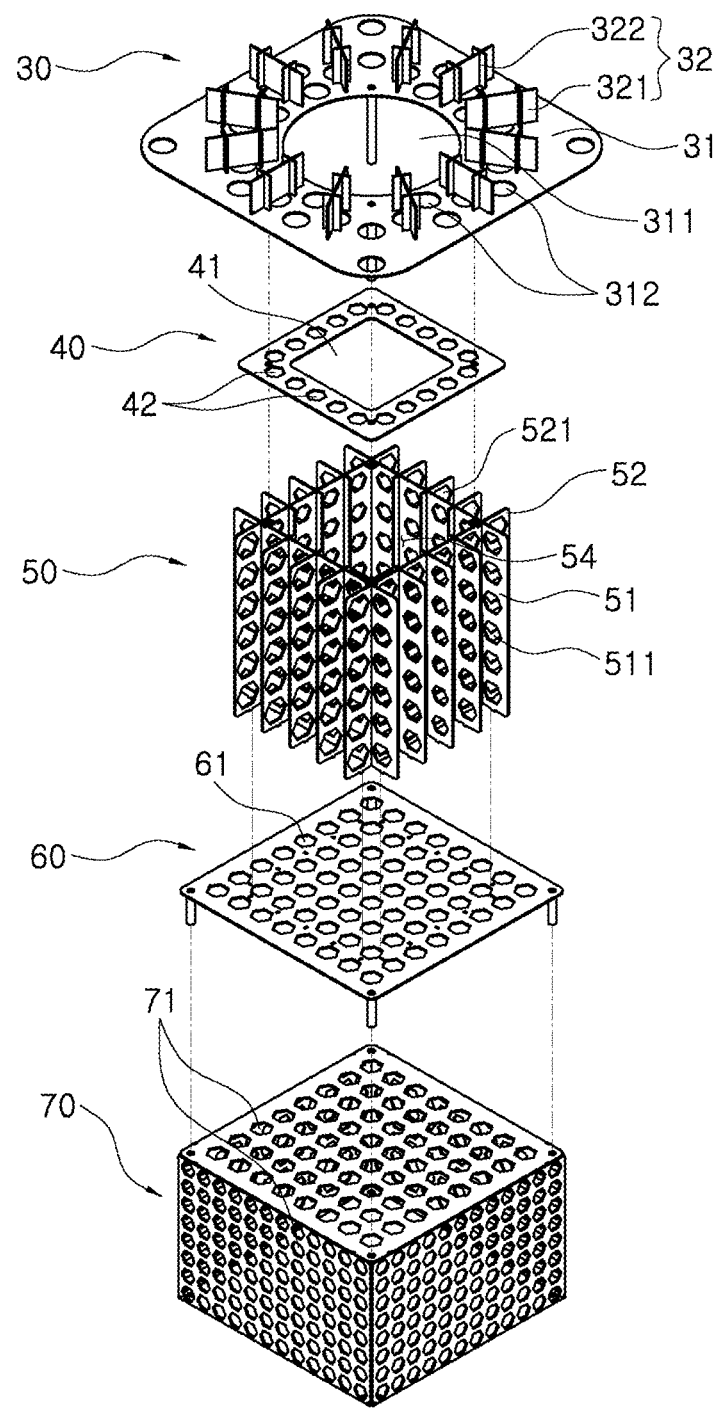
FIG. 3 is an exploded-perspective view partly illustrating the apparatus for collecting a by-product in a semiconductor process according to the first embodiment of the present invention.
Figure 4:
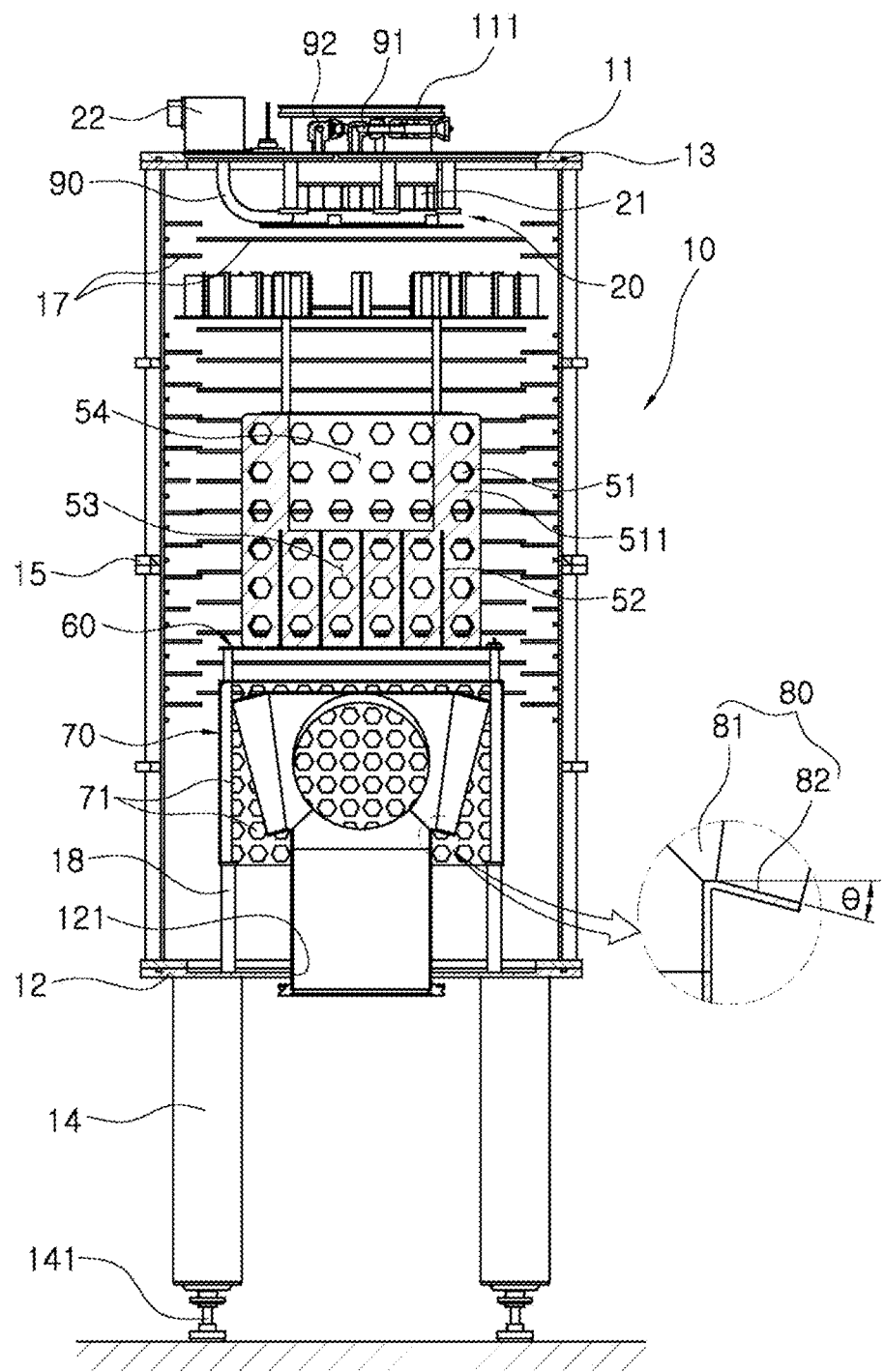
FIG. 4 is a front sectional view illustrating the apparatus for collecting a by-product in a semiconductor process according to the first embodiment of the present invention.
Figure 5:
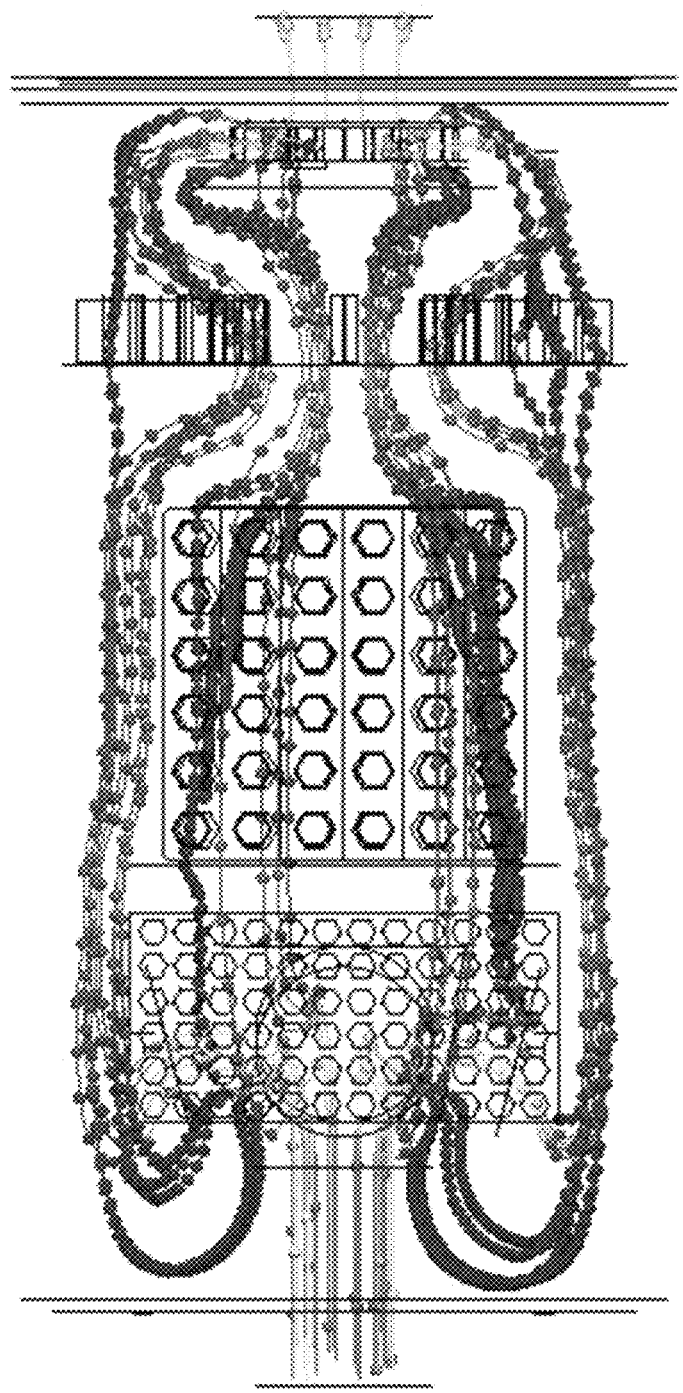
FIG. 5 is a front view illustrating an exhaust gas flow diagram in which an exhaust gas flows and is vortexed in an evenly distributed manner and by-products are collected in the apparatus for collecting a by-product in a semiconductor process according to the first embodiment of the present invention.

FIG. 1 is a perspective view of an apparatus for collecting a by-product in a semiconductor process according to a first or second embodiment of the present invention; FIG. 2 is an exploded-perspective view illustrating the apparatus for collecting a by-product in a semiconductor process according to the first embodiment of the present invention; FIG. 3 is an exploded-perspective view partly illustrating the apparatus for collecting a by-product in a semiconductor process according to the first embodiment of the present invention; FIG. 4 is a front sectional view illustrating the apparatus for collecting a by-product in a semiconductor process according to the first embodiment of the present invention; and FIG. 5 is a front view illustrating an exhaust gas flow diagram in which an exhaust gas flows and is vortexed in an evenly distributed manner and by-products are collected in the apparatus for collecting a by-product in a semiconductor process according to the first embodiment of the present invention.

Figure 6:
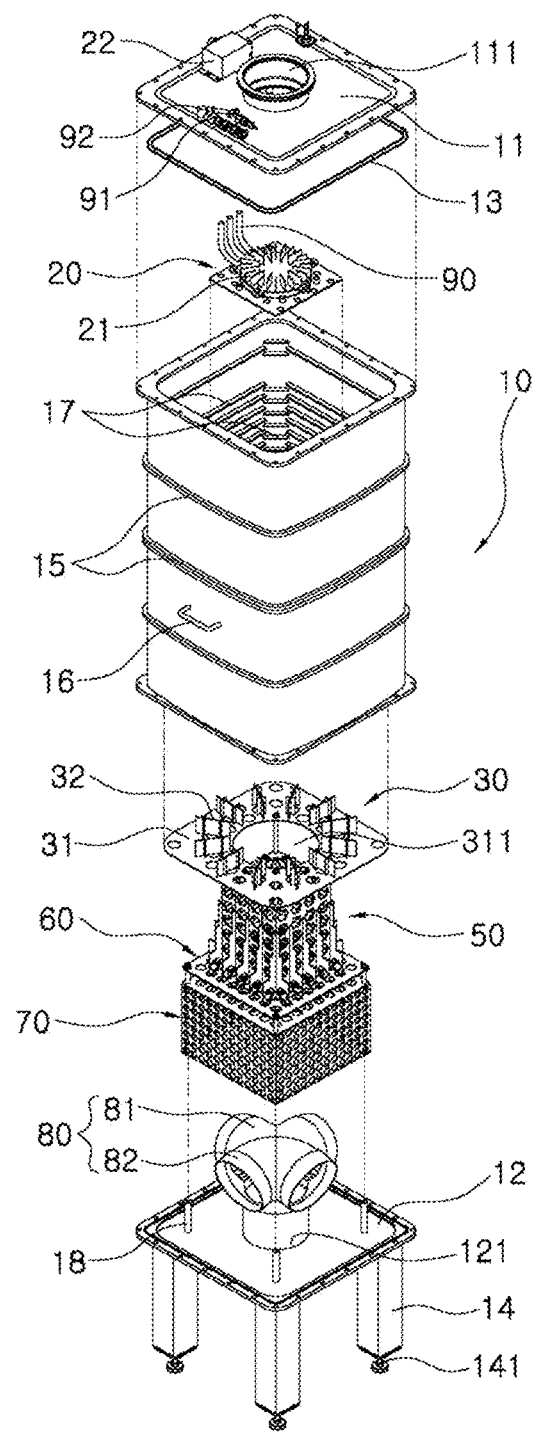
FIG. 6 is an exploded-perspective view illustrating the apparatus for collecting a by-product in a semiconductor process according to the second embodiment of the present invention.
Figure 7:
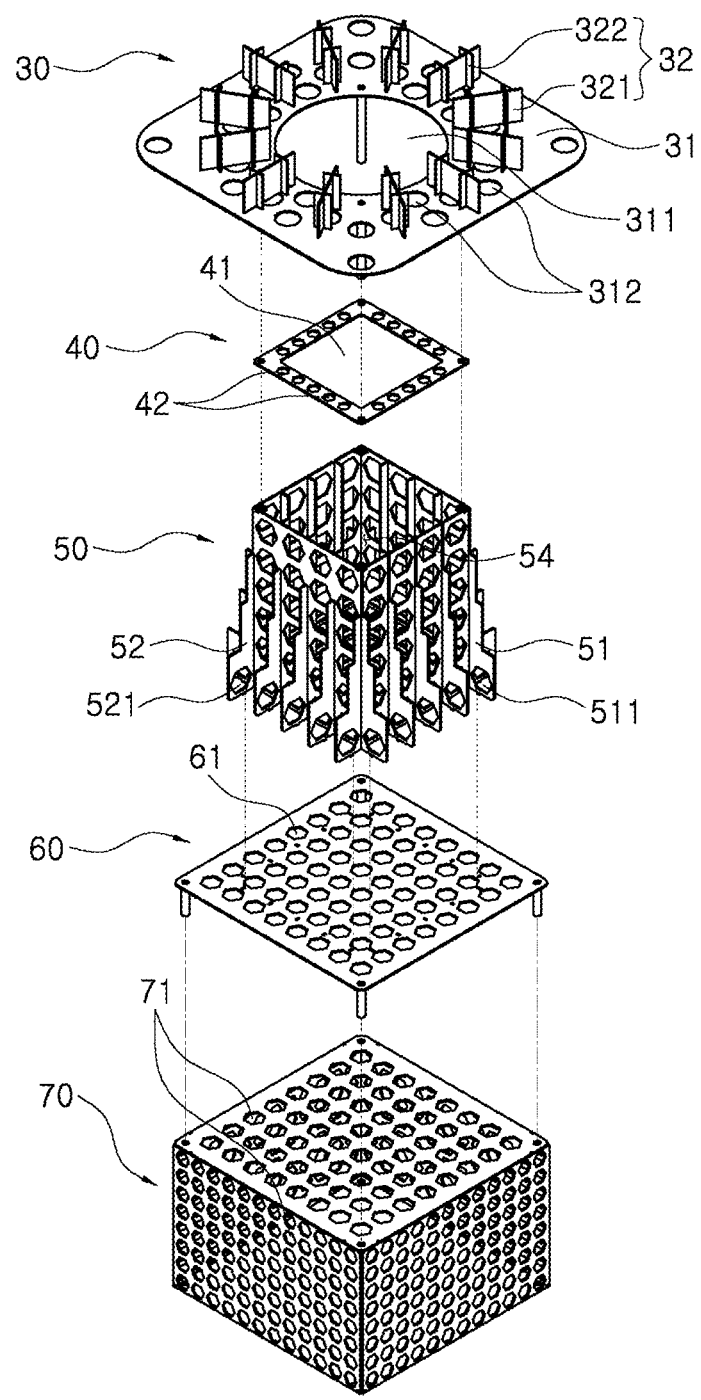
FIG. 7 is an exploded-perspective view partly illustrating the apparatus for collecting a by-product in a semiconductor process according to the second embodiment of the present invention.
Figure 8:
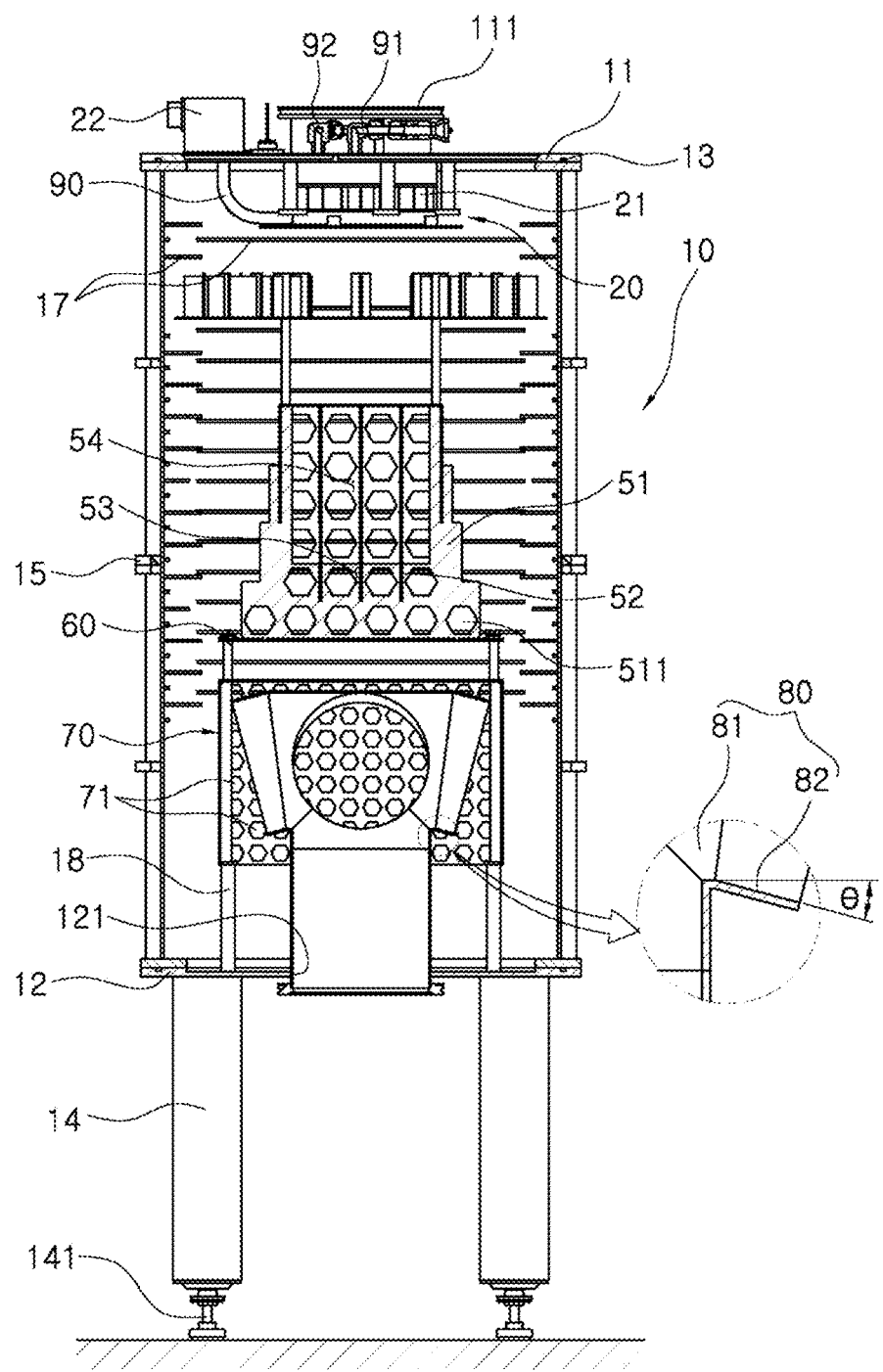
FIG. 8 is a front sectional view illustrating the apparatus for collecting a by-product in a semiconductor process according to the second embodiment of the present invention.
Figure 9:
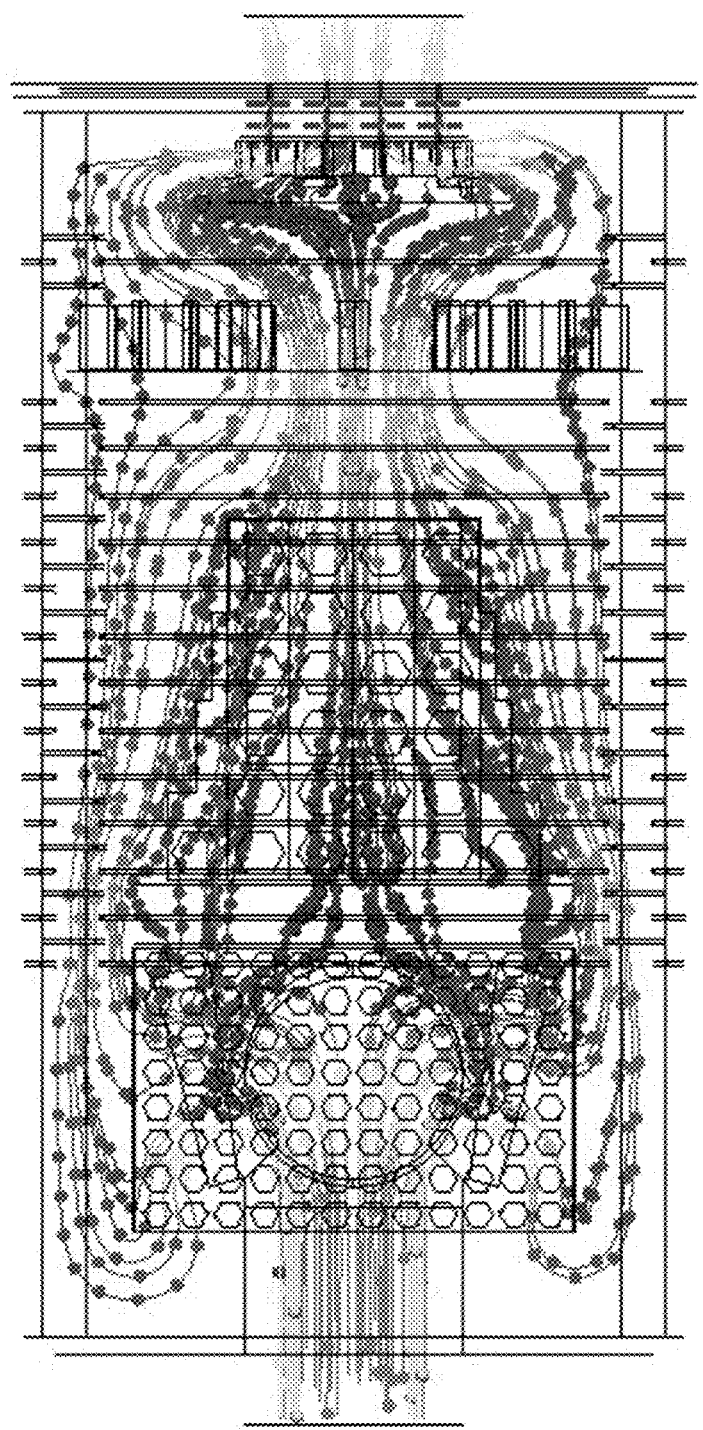
FIG. 9 is a front view illustrating an exhaust gas flow diagram in which an exhaust gas flows and is vortexed in an evenly distributed manner and by-products are collected in the apparatus for collecting a by-product in a semiconductor process according to the second embodiment of the present invention.
Figure 10A:
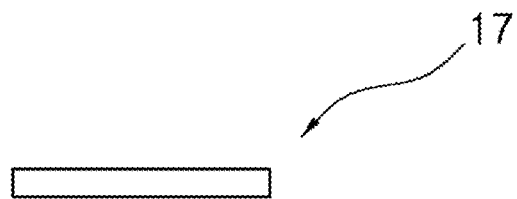
FIGS. 10A to 10E are side cross-sectional views each illustrating an embodiment of a vortex generating plate of the apparatus according to the present invention.
Figure 10B:
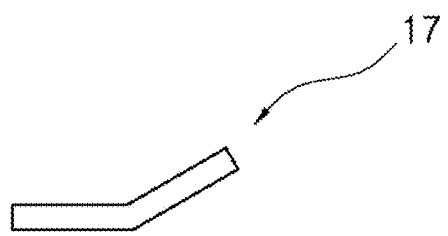
Figure 10C:
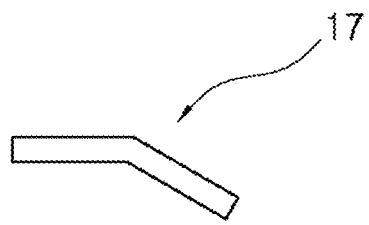
Figure 10D:
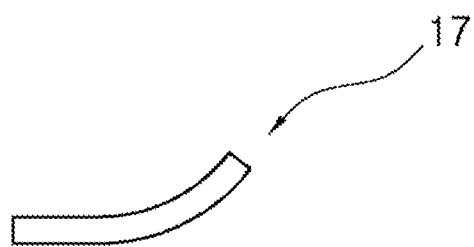
Figure 10E:
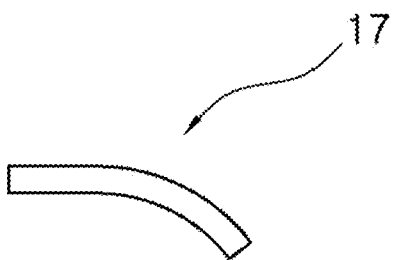

In addition, FIG. 6 is an exploded-perspective view illustrating the apparatus for collecting a by-product in a semiconductor process according to the second embodiment of the present invention; FIG. 7 is an exploded-perspective view partly illustrating the apparatus for collecting a by-product in a semiconductor process according to the second embodiment of the present invention; FIG. 8 is a front sectional view illustrating the apparatus for collecting a by-product in a semiconductor process according to the second embodiment of the present invention; and FIG. 9 is a front view illustrating an exhaust gas flow diagram in which an exhaust gas flows and is vortexed in an evenly distributed manner and by-products are collected in the apparatus for collecting a by-product in a semiconductor process according to the second embodiment of the present invention.

Further, FIGS. 10A to 10E are side cross-sectional views each illustrating an embodiment of a vortex generating plate of the apparatus according to the present invention; FIGS. 11A to 11F are photos respectively showing by-products collected on a bottom surface of an upper plate of a heater plate, on the front and the inside of a by-product collecting tower, and on the outside of the window, after collecting by-products through the apparatus for collecting a by-product in a semiconductor process according to the first embodiment of the present invention; and FIGS. 12A to 12D are photos taken from cross-sectional views and showing bottom, upper, and front surfaces of a by-product collecting tower separated from a housing, after collecting by-products through the apparatus for collecting a by-product in a semiconductor process according to the first embodiment of the present invention.

According to the first embodiment of the present invention, there is provided an apparatus for collecting a by-product in a semiconductor process, the apparatus provided on a line between a process chamber and a vacuum pump to collect a by-product in gas exhausted from the process chamber, and the apparatus including:

a housing 10 provided with a gas inlet 111 and a gas outlet 121 respectively provided on an upper plate 11 and a lower plate 12, which are detachably coupled to upper and lower openings respectively, and configured with a passage through which gas exhausted from the process chamber flows;

a heater plate 20 provided with multiple heat-dissipation fins 21, which are arranged radially with respect to a vertical direction, provided on a bottom surface of the upper plate 11, and heating an exhaust gas to supply energy required for chemically changing the exhaust gas introduced through the gas inlet 111 of the upper plate 11 and distributing the exhaust gas evenly in an inner space of the housing 10;

a heater power supply unit 22 provided at a side of the upper plate 11 of the housing 10 to supply a power to the heater plate 20;

a first upper horizontal bracket 30 having multiple by-product collecting members 32, which are fixed on an upper surface of a quadrangular plate 31 having a relatively large-diameter vertical mass gas passing opening 311 at the center thereof in a radial direction with respect to the center point, allowing most of the exhaust gas introduced to the housing 10 through the gas inlet 111 of the upper plate 11 to pass therethrough in the vertical direction, partly distributing the remaining exhaust gas evenly in the horizontal direction, and collecting a part of the by-product in a powder form;

a second upper horizontal bracket 40 having multiple minute gas passing holes 42, which have a relatively small diameter and is formed at an outer perimeter of a relatively large-area vertical mass gas passing opening 41 formed at the center thereof, disposed spaced apart a predetermined distance from the bottom of the first upper horizontal bracket 30 by multiple supporters 18 to evenly distribute the exhaust gas introduced through the first upper horizontal bracket 30 in the horizontal and vertical directions and to collect a part of the by-product in a powder form;

a by-product collecting tower 50 having a structure in which multiple first and second directional vertical plates 51 and 52 having multiple horizontal gas passing holes 511 and 521 are assembled in a lattice form in a manner that intersects each other in a direction of 90 degree angles, disposed between the second upper horizontal bracket 40 and a lower horizontal bracket 60 to allow the exhaust gas introduced through the second upper horizontal bracket 40 in the vertical direction or introduced through the inner space of the housing 10 in a lateral direction to pass in the vertical direction and collecting a part of the by-product in a powder form;

the lower horizontal bracket 60 having multiple gas holes 61 spaced a predetermined distance apart from each other, provided fixedly below a lower surface of the by-product collecting tower 50 in the horizontal direction, guiding the exhaust gas vertically introduced through the by-product collecting tower 50 toward a window 70, and collecting a part of the by-product contained in the exhaust gas in a powder form;

the window 70 having a structure in which five rectangular plates having multiple gas suction holes 71 are assembled in a rectangular shape with a bottom surface opened, configured to be provided fixedly spaced a predetermined distance from the bottom of the lower horizontal bracket 60 and in which a bottom surface thereof is spaced a predetermined distance apart from an upper surface of the lower plate 12 of the housing 10 by the multiple supporters 18, and blocking the by-product that passes through the by-product collecting tower 50 and the lower horizontal bracket 60 or flows in the lateral direction through the inner space of the housing 10 and then is converted into the powder form from directly introducing toward a gas collecting and discharging port 80 and guiding only the exhaust gas toward the gas collecting and discharging port 80; and the gas collecting and discharging port 80 provided at an upper portion thereof with an exhaust gas suction opening 81 having "+" shape which is opened in four directions, disposed vertically between the inside of the window 70 and a gas discharge opening 121 provided on the lower plate 12 of the housing 10, and collecting the exhaust gas introduced from upper, front, rear, and sides through the gas suction holes 71 of the window 70 and through the bottom of the window 70 which is opened to discharge the exhaust gas outside.

Further, according to the second embodiment of the present invention, there is provided an apparatus for collecting a by-product in a semiconductor process, the apparatus provided on a line between a process chamber and a vacuum pump to collect a by-product in gas exhausted from the process chamber, and the apparatus including:

a housing 10 provided with a gas inlet 111 and a gas outlet 121 respectively provided on an upper plate 11 and a lower plate 12, which are detachably coupled to upper and lower openings respectively, and configured with a passage through which gas exhausted from the process chamber flows;

a heater plate 20 provided with multiple heat-dissipation fins 21, which are arranged radially with respect to a vertical direction, provided on a bottom surface of the upper plate 11, and heating an exhaust gas to supply energy required for chemically changing the exhaust gas introduced through the gas inlet 111 of the upper plate 11 and distributing the exhaust gas evenly in an inner space of the housing 10;

a heater power supply unit 22 provided at a side of the upper plate 11 of the housing 10 to supply a power to the heater plate 20;

a first upper horizontal bracket 30 having multiple by-product collecting members 32, which are fixed on an upper surface of a quadrangular plate 31 having a relatively large-diameter vertical mass gas passing opening 311 at the center thereof in a radial direction with respect to the center point, allowing most of the exhaust gas introduced to the housing 10 through the gas inlet 111 of the upper plate 11 to pass therethrough in the vertical direction, partly distributing the remaining exhaust gas evenly in the horizontal direction, and collecting a part of the by-product in a powder form;

a second upper horizontal bracket 40 having multiple minute gas passing holes 42, which have a relatively small diameter and is formed at an outer perimeter of a relatively large-area vertical mass gas passing opening 41 formed at the center thereof, disposed spaced apart a predetermined distance from the bottom of the first upper horizontal bracket 30 by multiple supporters 18 to evenly distribute the exhaust gas introduced through the first upper horizontal bracket 30 in the horizontal and vertical directions and to collect a part of the by-product in a powder form;

a by-product collecting tower 50 having a rectangular tower shape whose four sides are stepped in which multiple first and second directional vertical plates 51 and 52 having multiple horizontal gas passing holes 511 and 521 and cut at different heights are assembled in a lattice form, disposed between the second upper horizontal bracket 40 and a lower horizontal bracket 60, allowing a part of the exhaust gas introduced through the second upper horizontal bracket 40 to pass in the vertical direction and allowing the remaining exhaust gas to flow on the four sides in stepped manner or flow slantingly along the four sides, and collecting a part of the by-product in a powder form;

the lower horizontal bracket 60 having multiple gas holes 61 spaced a predetermined distance apart from each other, provided fixedly below a lower surface of the by-product collecting tower 50 in the horizontal direction, guiding the exhaust gas vertically introduced through the by-product collecting tower 50 toward a window 70, and collecting a part of the by-product contained in the exhaust gas in a powder form;

the window 70 having a structure in which five rectangular plates having multiple gas suction holes 71 are assembled into a rectangular shape with a bottom surface opened, configured in which the window 70 is provided fixedly to be spaced a predetermined distance from the bottom of the lower horizontal bracket 60 and in which a bottom surface thereof is spaced a predetermined distance apart from an upper surface of the lower plate 12 of the housing 10 by the multiple supporters 18, and blocking the by-product that passes through the by-product collecting tower 50 and the lower horizontal bracket 60 or flows in the lateral direction through the inner space of the housing 10 and then is converted into the powder form from directly introducing toward a gas collecting and discharging port 80 and guiding only the exhaust gas toward the gas collecting and discharging port 80; and the gas collecting and discharging port 80 provided at an upper portion thereof with an exhaust gas suction opening 81 having "+" shape which is opened in four directions, disposed vertically between the inside of the window 70 and a gas discharge opening 121 provided on the lower plate 12 of the housing 10, and collecting the exhaust gas introduced from upper, front, rear, and sides through the gas suction holes 71 of the window 70 and through the bottom of the window 70 which is opened to discharge the exhaust gas outside.

In the above two embodiments of the present invention, multiple minute gas passing holes 312, which have a diameter smaller than the vertical mass gas passing opening 311 provided on the center of the quadrangular plate 31, may be further provided on the quadrangular plate 31 of the first upper horizontal bracket 30 such that a part of the exhaust gas flowing horizontally along the upper surface of the quadrangular plate 31 of the first upper horizontal bracket 30 flows toward the second upper horizontal bracket 40 and the by-product collecting tower 50 through the multiple minute gas passing holes 312.

In addition, the by-product collecting members 32 disposed on the upper surface of the first upper horizontal bracket 30 may include:

multiple gas flow guiding plates 321 radially arranged in a vertically erected state; and multiple by-product collecting plates 322 crossed at right angles to the gas flow guide plates 321 while being spaced at a predetermined distance from one another.

In addition, in the above two embodiments, among the multiple first and second directional vertical plates 51 and 52 constituting the by-product collecting tower 50, first and second directional vertical plates 51 and 52 located on the inner side are configured to have heights smaller than those located on the outer side of the four sides such that a powder collecting portion 54 is formed in an upper part of the inside of the by-product collecting tower 50, which has a volume of ½ or ⅓ of the total internal volume.

Each end of the four exhaust gas suction opening 81 integrally provided on an upper portion of the gas collecting and discharging port 80 disposed to face four surfaces of the housing 10 is provided with an inclined exhaust gas guiding pipe 82 inclined downwardly at a predetermined angle ($\theta$) to suck, collect, and discharge the exhaust gas passing through the window 50 and guided to the lower portion of the housing 10.

Here, an inclined angle of the inclined exhaust gas guiding pipe 82 provided in the exhaust gas suction opening 81 of the gas collecting and discharging port 80 may be in a range of 10 degree angles to 20 degree angles.

In addition, a cooling pipe 90 through which a coolant flows may be embedded inside the upper plate 11 of the housing 10, and a coolant inlet 91 and a coolant outlet 92 connected to both ends of the cooling pipe 90 respectively may be provided on an upper surface of the upper plate 11 such that the upper plate 11 is prevented from being overheated due to heat produced from the heater plate 20, whereby a sealing or a gasket 13 provided between upper surface of the housing 10 and the bottom surface of the upper plate 11 is prevented from being damaged and the by-product powder is collected on the bottom surface of the upper plate 11.

Furthermore, multiple vortex generating plates 17 may further provided, the multiple vortex generating plates 17 installed at a predetermined height from an inner wall of the housing 10 in the vertical direction in order to allow the exhaust gas passing through the inside of the housing 10 to vortex.

Here, the vortex generating plates may be formed to have a side cross-sectional surface among shapes of "–", " ", " ", " ", " ", and " ".

In addition, multiple legs 14, each having a height adjusting bolt/support 141, may be provided at a lower end of the bottom surface of the lower plate 12 of the housing 10 in the vertical direction.

In addition, multiple housing deformation preventing rings 15 may be further provided on an outer surface of the housing 10 at a predetermined distance on the vertical direction, in order to prevent the shape of the housing 10 having a predetermined volume from being deformed by a suction force generated in operation of a vacuum pump.

In addition, a pair of handles 16 may be further provided on front and rear surfaces, or both side surfaces of the housing 10.

Operation effects of the apparatus for collecting a by-product in a semiconductor process of the present invention constructed as described above will be described as follows.

As shown in FIGS. 1 to 4, in order to simplify the structure and increase the collecting capacity of the by-product greatly, each apparatus of the embodiments of the present invention is configured to include the housing 10, the heater plate 20, the heater power supply unit 22, the first upper horizontal bracket 30, the second upper horizontal bracket 40, the by-product collecting tower 50, the lower horizontal bracket 60, the window 70, and the gas collecting and discharging port 80. Accordingly, it is possible to greatly extend a replacement period of the apparatus for collecting a by-product in a semiconductor manufacturing apparatus, and to collect by-products quickly and efficiently over a long period of time.

Most of components constituting each apparatus of the embodiments of the present invention are made using titanium (Grades 1 to 4), SUS304, SUS316, aluminum, or the like, to prevent corrosion caused by the exhaust gas discharged from the processor chamber.

As shown in FIGS. 2 to 4 and FIGS. 6 to 8, among the components of the above embodiments, the housing 10 is formed into a hollow rectangular shape having a relatively large volume. Specifically, in the housing 10, the upper opening is detachably coupled to the upper plate 11 having the gas inlet 111 through multiple bolts or the like. In addition, the lower opening is detachably coupled to the lower plate 12 having the gas outlet 121 through multiple bolts or the like. Furthermore, the housing 10 is configured with the passage through which the exhaust gas discharged from the processor chamber for manufacturing a semiconductor flows.

Here, the multiple legs 14, each having the height adjusting bolt/support 141, may be provided at the lower end of the bottom surface of the lower plate 12 of the housing 10 in the vertical direction. Accordingly, it is possible to install the apparatus of the present invention regardless of a place, and easily adjust a level of the housing 10 having a relatively large volume through the height adjusting bolts/supports 141. In particular, it is possible to secure a sufficient space between the floor where the apparatus of the present invention is installed and the bottom surface of the housing 10 such that it is possible to easily connect a vacuum pump (not shown) to the gas collecting and discharging port 80, which will be described later, or to easily separate the vacuum pump from the gas collecting and discharging port 80.

In addition, the multiple housing deformation preventing rings 15 of the embodiments of the present invention are further provided on the outer surface of the housing 10 at a predetermined distance on the vertical direction such that it is possible to prevent the shape of the housing 10 having a predetermined volume from being deformed due to the suction force generated in operation of the vacuum pump having a strong suction force, thereby enhancing the robustness of the product and significantly extending the service life of the product.

In addition, the pair of handles 16 of the embodiments of the present invention is further provided on the front and rear surfaces, or both side surfaces of the housing 10 in the present invention such that it is possible to carry and move the apparatus collecting a by-product of the present invention easily and conveniently.

In addition, the heater plate 20 is made of ceramic or inconel material to prevent corrosion caused by the exhaust gas, has the multiple heat-dissipation fins 21, which are arranged radially with respect to the vertical direction, and is detachably provided on the bottom surface of the upper plate 11.

In addition, the heater power supply unit 22 is provided at a side of the upper plate 11 of the housing 10 to smoothly supply power to the heater plate 20 and facilitate maintenance.

As described above, when providing the heater plate 20 and the heater power supply unit 22 on the upper plate 11 of the housing 10 and heating an upper space of the housing 10 including the upper plate 11, the exhaust gas flowing through the gas inlet 111 of the upper plate 11 from the processor chamber passes through the heater plate 20 and causes an enormous chemical change due to the heating. In addition, it is possible to evenly distribute the exhaust gas inside the by-product collecting tower 50 and the housing 10 (including an upper portion of the first and second upper horizontal brackets 30 and 40, which will be described later) through the heat-dissipation fins 21 radially arranged on the upper surface of the heater plate 20.

In addition, as shown in FIG. 3, the first upper horizontal bracket 30, which is one of the components of the embodiments of the present invention, has the vertical mass gas passing opening 311 having a relatively large diameter at the center of the quadrangular plate 31 having a predetermined area. Furthermore, the first upper horizontal bracket 30 has a configuration in which the multiple by-product collecting members 32 are fixed on the upper surface of the quadrangular plate 31 in the radial direction with respect to the center point.

The first upper horizontal bracket 30 is disposed spaced a predetermined distance (i.e., height) from the top of the second upper horizontal bracket 40 such that the first upper horizontal bracket 30 allows most of the exhaust gas introduced to the housing 10 through the gas inlet 111 of the upper plate 11 to vertically pass through the vertical mass gas passing opening 311 having a relatively large diameter, partly distributes the remaining exhaust gas evenly in the horizontal direction, and collects a part of the by-product in a powder form.

In addition, the present invention may further have the multiple minute gas passing holes 312, which have a diameter smaller than that of the vertical mass gas passing opening 311 provided on the center of the quadrangular plate 31, on the quadrangular plate 31 of the first upper horizontal bracket 30.

Therefore, a part of the exhaust gas flowing horizontally on the upper surface of the quadrangular plate 31 of the first upper horizontal bracket 30 along a space provided between the by-product collecting members 32 flows toward the second upper horizontal bracket 40 and the upper surface of the by-product collecting tower 50 through the multiple minute gas passing holes 312 by the suction forces of the exhaust gas and the vacuum pump, and the like, whereby the exhaust gas can be more evenly distributed and thus the efficiency of collecting the by-product using the first upper horizontal bracket 30 can be further increased.

The by-product collecting members 32 disposed on the upper surface of the first upper horizontal bracket 30 and directly collecting most of the by-product have a shape in which the gas flow guiding plates 321 and the multiple by-product collecting plates 322 are assembled to be in a substantially "✚" shape in a plan view.

Here, the gas flow guiding plates 321, which are one of the components of the by-product collecting members 32, have a rectangular plate shape having different side lengths and are arranged radially in a state of being vertically erected from the upper surface of the quadrangular plate 31. Accordingly, the gas flow guiding plates 321 serve to guide the introduced exhaust gas to be distributed evenly in the vertical direction and serve to collect the by-product, which is changed into a powder form.

In addition, the multiple by-product collecting plates 322, which are one of the components of the by-product collecting members 32, have a rectangular plate shape having a side length shorter than that of the gas flow guiding plates 321 and have a configuration crossed at right angles to the gas flow guiding plates 321 while being spaced at a predetermined distance from one another. Accordingly, the exhaust gas flowing in the horizontal direction bumps into the multiple by-product collecting plates 322 having a large frictional force and a diffracting force whereby the multiple by-product collecting plates 322 serves to collect as much as possible the by-product having a powder form on a surface thereof and a surface of the gas flow guiding plates 321.

In addition, the second upper horizontal bracket 40 of the embodiments of the present invention has the vertical mass gas passing opening 41 having a relatively large area at the center thereof, and has the multiple minute gas passing holes 42 having a relatively small diameter and formed in rectangular plates at the outer perimeter of the vertical mass gas passing opening 41.

The second upper horizontal bracket 40 is fixed on the upper surface of the by-product collecting tower 50 horizontally, specifically, disposed spaced apart a predetermined distance (i.e., height) from the bottom of the first upper horizontal bracket 30 by the multiple supporters 18. Accordingly, the second upper horizontal bracket 40 allows most of the exhaust gas introduced through the first upper horizontal bracket 30 to evenly flow toward the by-product collecting tower 50 in the vertical direction through the vertical mass gas passing opening 41 and the multiple minute gas passing holes 42, and partly distributes the remaining exhaust gas evenly in the horizontal direction (i.e., laterally distributes along the upper surfaces). Thus, a temperature of the exhaust gas is lowered to an extent such that the second upper horizontal bracket 40 serves to collect a part of the by-product on the surface thereof in a powder form.

As shown in FIGS. 2 to 4, the by-product collecting tower 50, which is one of the components of the apparatus of the first embodiment of the present invention, has a structure in which the multiple first and second directional vertical plates 51 and 52, which are rectangular plates and in which the multiple horizontal gas passing holes 511 and 521 are provided to be spaced a predetermined distance from each other, are assembled in a lattice form in a manner that intersects each other in a direction of 90 degree angles and is disposed in the vertical direction between a bottom surface of the second upper horizontal bracket 40 and an upper surface of the lower horizontal bracket 60.

As shown in FIG. 5, the by-product collecting tower 50 allows the exhaust gas introduced in the vertical direction through the vertical mass gas passing opening 41 and the multiple minute gas passing holes 42 provided on the second upper horizontal bracket 40 or introduced in the lateral direction through the inner space of the housing 10 to pass toward the multiple horizontal gas passing holes 511 and 521, which are provided on the multiple first and second directional vertical plates 51 and 52 respectively, and through a lattice space 53 in the horizontal and vertical directions. As a result, by-product collecting tower 50 lowers a temperature of the exhaust gas such that the by-product collecting tower 50 collects a part of the by-product in a powder form on surfaces of the first and second directional vertical plates 51 and 52, as shown in FIGS. 12A to 12D.

Here, it is preferable that the multiple horizontal gas passing holes 511 and 521 on the first and second directional vertical plates 51 and 52 of the by-product collecting tower 50 are 10 mm to 20 mm in diameter and the first and second directional vertical plates 51 and 52 have porosities of 35 to 40 with respect to the total area thereof, such that only 35% to 45% of the exhaust gas passes through the multiple horizontal gas passing holes 511 and 521 respectively provided on the first and second directional vertical plates 51 and 52, the remaining exhaust gas flows directly to the lower horizontal bracket 60 through the lattice space 53, and a part of the by-product is attached and collected as a powder form on the surfaces of the first and second directional vertical plates 51 and 52 of the by-product collecting tower 50.

In addition, among the multiple first and second directional vertical plates 51 and 52 constituting the by-product collecting tower 50 in the embodiment of the present invention, first and second directional vertical plates 51 and 52 located on the inner side are configured to have heights approximately ½ or ⅓ of those located on the outer side of the four sides.

Therefore, since the powder collecting portion 54 having a relatively large volume of ½ or ⅓ volume with respect to the total internal volume is formed in the upper portion of the inside of the by-product collecting tower 50, a larger amount of by-product can be collected in a powder form through the powder collecting portion 54 of the by-product collecting tower 50, thereby maximizing the efficiency of collecting the by-product.

As shown in FIGS. 6 to 8, the by-product collecting tower 50 of the second embodiment of the apparatus of the present invention has a rectangular tower shape whose four sides, i.e., front, rear, left, and right sides, are stepped in which the multiple first and second directional vertical plates 51 and 52 having the multiple horizontal gas passing holes 511 and 521 and cut at different heights are assembled in a lattice form such that multiple lattice spaces 53 are formed in the vertical direction in which the exhaust gas flows. In addition, the by-product collecting tower 50 is disposed between the second upper horizontal bracket 40 and a lower horizontal bracket 60 in the vertical direction.

As shown in FIG. 9, the by-product collecting tower 50 allows most of the exhaust gas introduced in the vertical direction through the vertical mass gas passing opening 41 and the multiple minute gas passing holes 42 provided on the second upper horizontal bracket 40 or introduced in the lateral direction through the inner space of the housing 10 to pass toward the multiple horizontal gas passing holes 511 and 521, which are provided on the multiple first and second directional vertical plates 51 and 52 respectively, and through the lattice space 53 in the horizontal and vertical directions and allows the remaining exhaust gas to flow on the four sides in stepped manner or flow slantingly along the four sides. As a result, by-product collecting tower 50 lowers a temperature of the exhaust gas such that the by-product collecting tower 50 collects a part of the by-product in a powder form on the surfaces of the first and second directional vertical plates 51 and 52.

Here, among the multiple first and second directional vertical plates 51 and 52 constituting the by-product collecting tower 50 in the second embodiment of the present invention, first and second directional vertical plates 51 and 52 located on the inner side are configured to have heights approximately ½ or ⅓ of those located on the outer side of the four sides, as in the first embodiment.

Therefore, since the powder collecting portion 54 having a relatively large volume of ½ or ⅓ of the total internal volume is formed in the upper portion of the inside of the by-product collecting tower 50, a larger amount of by-product can be collected in a powder form through the powder collecting portion 54 of the by-product collecting tower 50, thereby maximizing the efficiency of collecting the by-product.

In addition, the lower horizontal bracket 60 of the embodiments of the present invention is formed in a rectangular plate in which the multiple gas holes 61 having a relatively small diameter and having a predetermined size are spaced a predetermined distance apart from each other. The lower horizontal bracket 60 is provided fixedly on the bottom surface of the by-product collecting tower 50 in the horizontal direction to guide the exhaust gas vertically introduced through the by-product collecting tower 50 toward the window 70 and to collect a part of the by-product on the surface thereof in a powder form by lowering the temperature of the exhaust gas.

In addition, the window 70 of the embodiments of the present invention has a structure in which the five rectangular plates each having the multiple gas suction holes 71 are assembled into a rectangular shape with the bottom surface opened and the window 70 is configured such that an upper surface thereof is provided fixedly to be spaced a predetermined distance (i.e., height) from the bottom of the lower horizontal bracket 60 and in which the bottom surface thereof is spaced a predetermined distance apart from the upper surface of the lower plate 12 of the housing 10 by the multiple supporters 18.

The window 70 blocks the by-product from being directly introducing toward the gas collecting and discharging port 80 and guides only the exhaust gas toward the gas collecting and discharging port 80, the by-product being introduced into the housing 10, passing through the by-product collecting tower 50 and the lower horizontal bracket 60 or flowing in the lateral direction through the inner space of the housing 10, and then being converted into the powder form. As a result, the window 70 prevents the gas collecting and discharging port 80 from being clogged by the powder-form by-product and prevents the vacuum pump or the like from being damaged by the by-product.

The gas collecting and discharging port 80 of the embodiments of the present invention has a tubular body in which the exhaust gas suction opening 81 is integrally provided as a "+" shape when viewed from above. In addition, the gas collecting and discharging port 80 is vertically installed in the window 70 such that a lower end thereof penetrates the gas outlet 121 provided on the lower plate 12 of the housing 10.

Figure 11A:
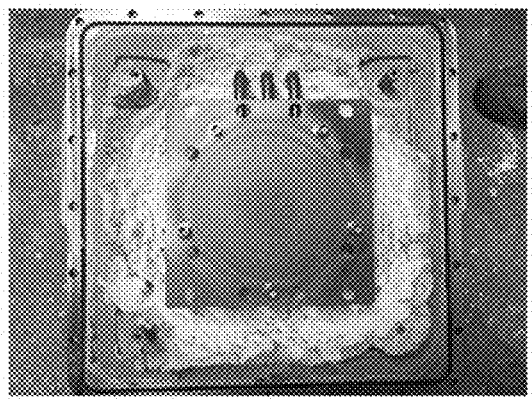
FIGS. 11A to 11F are photos respectively showing by-products collected on a bottom surface of an upper plate of a heater plate, on the front and the inside of a by-product collecting tower, and on the outside of the window, after collecting by-products through the apparatus for collecting a by-product in a semiconductor process according to the first embodiment of the present invention.
Figure 11B:
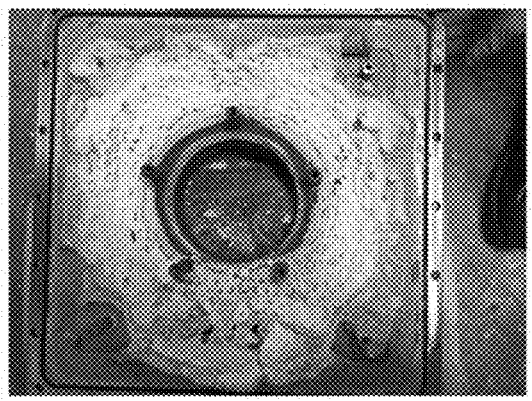
Figure 11C:
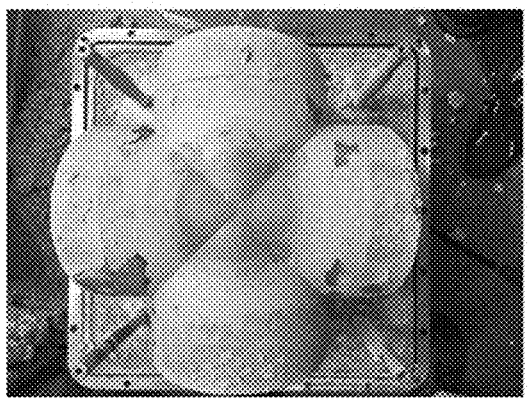
Figure 11D:
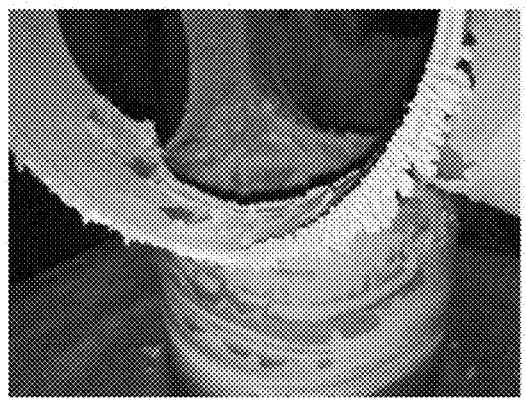

The gas collecting and discharging port 80 sucks and collects the exhaust gas, which passes through the by-product collecting tower 50 by the operation of the vacuum pump and then flows down to the lower portion of the housing 10, through the gas suction holes 71 of the window 70 from every direction and through the bottom of the window 70 having an opened form, and then discharges to outside. In addition, the gas collecting and discharging port 80 collects the by-product in a powder form through the inside and outside thereof, as shown in FIGS. 11C and 11D Here, when the four exhaust gas suction openings 81 integrally provided on the upper portion of the gas collecting and discharging port 80 disposed in four directions to face each side of the housing 10 (that is, front, rear, left, and right) are formed only in the horizontal direction, there is no problem in the suction and collecting efficiencies of the exhaust gas flowing through the gas suction holes 71 of the window 70. However, there is a problem in that the suction and collecting efficiencies on the exhaust gas reaching the bottom of the housing 10 may be lowered.

Therefore, in the present invention, each of the four exhaust gas suction openings 81 integrally provided at the upper portion of gas collecting and discharging port 80 is further provided with the inclined exhaust gas guiding pipes 82 inclined downwardly at a predetermined angle (θ; e.g., 10 degree angles to 20 degree angles) at the end thereof, as illustrated in enlarged views of FIGS. 4 and 8. Accordingly, a suction direction of the exhaust gas introduced through the exhaust gas suction openings 81 of the gas collecting and discharging port 80 is inclined such that, as illustrated in exhaust gas flow diagrams of FIGS. 5 and 8, the exhaust gas passing through the gas suction holes 71 provided respectively on upper, front, rear, and both side surfaces of the window 70 and the exhaust gas guided to the lower portion (i.e., bottom) of the housing 10 are sucked, collected, and exhausted to the vacuum pump.

As described above, in case that only the heater plate 20 is provided on the bottom surface of the upper plate 11 of the housing 10 to heat, a solid sealing member or the gasket 13 provided for sealing a contact portion between the upper surface of the housing 10 and the bottom surface of the upper plate 11 may be damaged by a high temperature when the upper plate 11 is heated to the high temperature.

Accordingly, in the present invention, the cooling pipe 90 is embedded inside the upper plate 11 of the housing 10, and the coolant inlet 91 and the coolant outlet 92 connected to both ends of the cooling pipe 90 respectively are provided on the upper surface of the upper plate 11.

When providing the cooling pipe 90 inside the upper plate 11 and allowing the coolant to flow through the cooling pipe 90, the upper plate 11 is prevented from being overheated due to the heat generated from the heater plate 20. Accordingly, the sealing or the gasket 13 provided between upper surface of the housing 10 and the bottom surface of the upper plate 11 can be prevented from being damaged. In addition, as the temperature of the upper plate 11 is significantly lowered by the coolant flowing in the cooling pipe 90, the by-product is collected in a powder form on the heater plate 20 as well as on the bottom surface of the upper plate 11 as shown in FIGS. 11A and 11B. As a result, the collecting efficiency of the apparatus can be further increased.

As shown in FIGS. 10A to 10E, in the present invention, the multiple vortex generating plates 17 are provided by welding or the like, the multiple vortex generating plates 17 installed at a predetermined height from an inner wall of the housing 10 in the vertical direction and formed to have a side cross-sectional surface among shapes of "–", and "  ", " 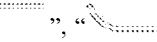 ", " 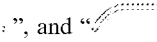 ", and "  ".

Therefore, a part of the exhaust gas, which is dispersed in the lateral direction in the housing 10 through the second upper horizontal bracket 40, the by-product collecting tower 50, the lower horizontal bracket 60, and the upper surface of the window and bumps against the inner wall of the housing 10, bumps against the vortex generating plates 17 and is vortexed as illustrated in FIGS. 5 and 9 such that a stagnation time of the exhaust gas in the housing 10 is increased, and thus the efficiency of the collecting the by-product of the exhaust gas can be increased.

Figure 11E:
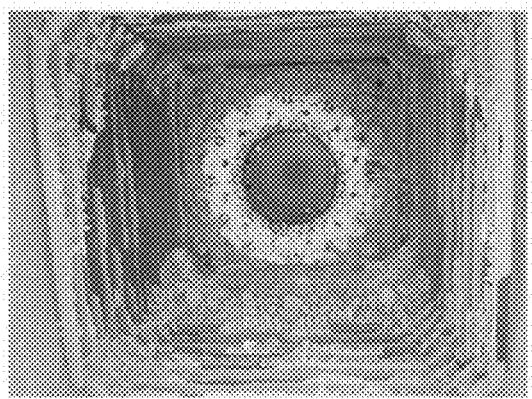
Figure 11F:
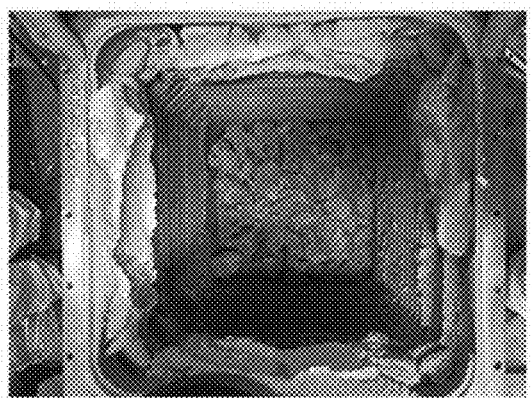
Figure 12A:
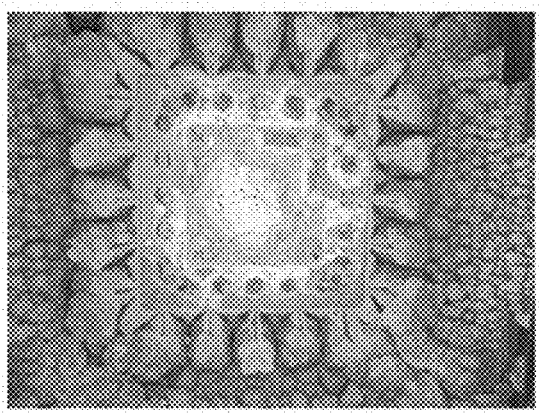
FIGS. 12A to 12D are photos taken from cross-sectional views and showing bottom, upper, and front surfaces of a by-product collecting tower separated from a housing, after collecting by-products through the apparatus for collecting a by-product in a semiconductor process according to the first embodiment of the present invention.
Figure 12B:
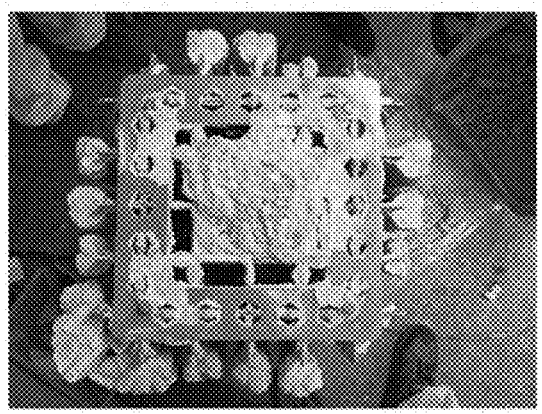
Figure 12C:
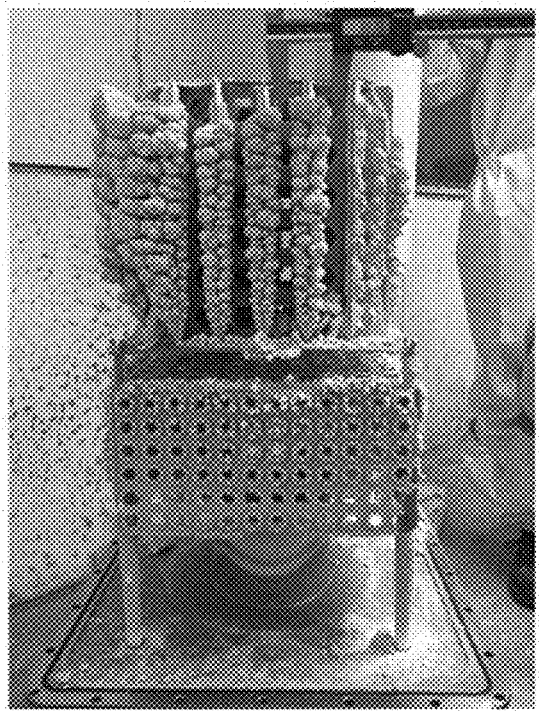
Figure 12D:
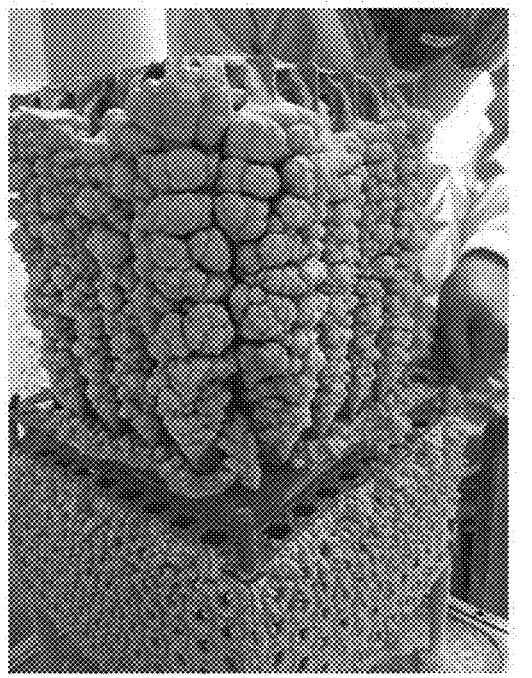
Figure 13:
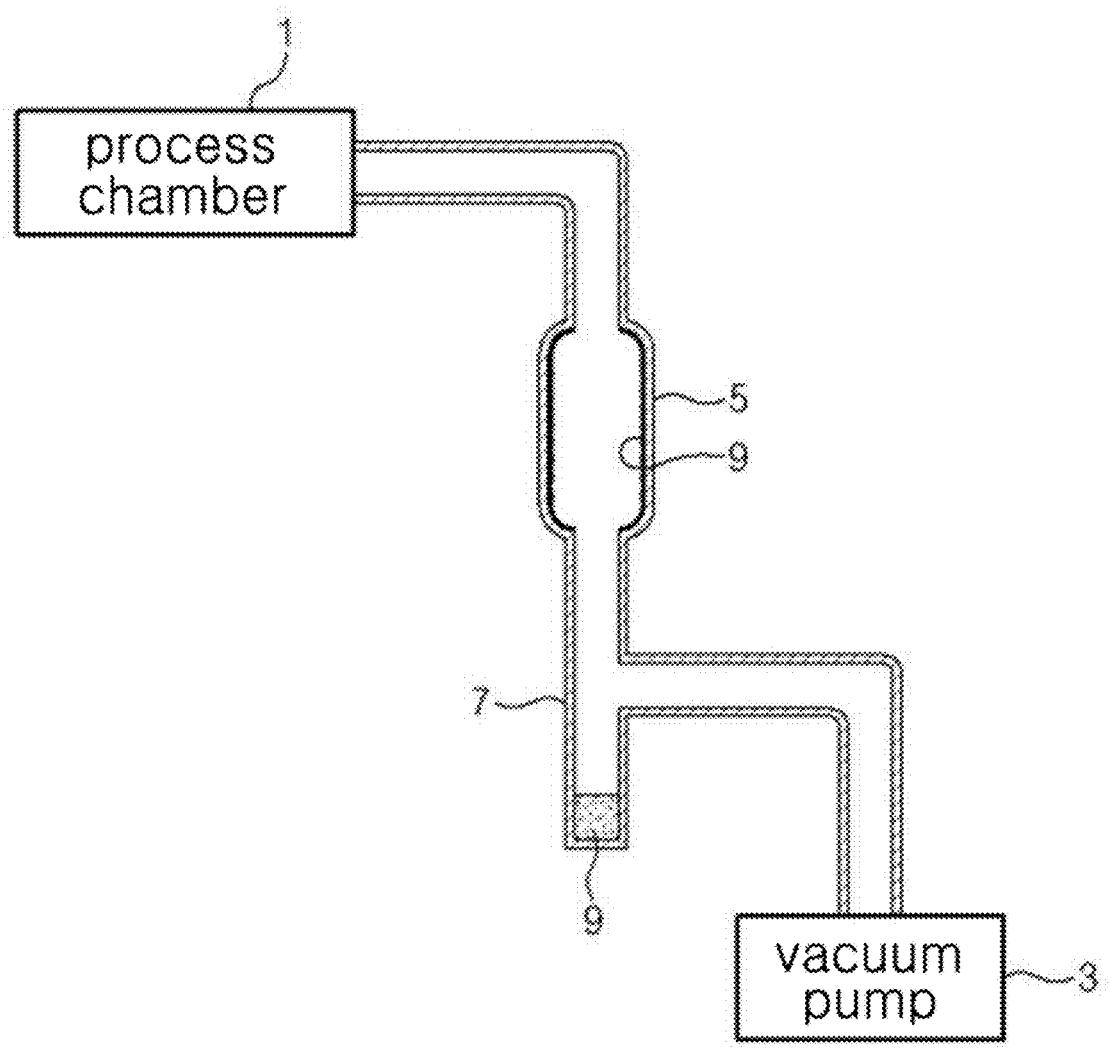
FIG. 13 is a schematic view illustrating a general system for collecting a by-product of the related art.

Particularly, because temperatures of the vortex generating plates 17 integrally provided on the inner wall of the housing 10, which comes into contact with the outside air having a temperature lower than the internal temperature of the housing 10, a large amount of by-products can be collected through the vortex generating plates 17 as shown in FIGS. 11E and 11F, in addition to through the above-described components (i.e., the heater plate 20, the first upper horizontal bracket 30, the second upper horizontal bracket 40, the by-product collecting tower 50, the lower horizontal bracket 60, and the window 70).

As described, the apparatus for collecting a by-product of the present invention can significantly increase collecting capacity and efficiency thereof, leading to extension of a replacement period of the apparatus for collecting a by-product in a semiconductor manufacturing apparatus. Thus, it is possible to reduce delay in semiconductor manufacturing process and reduce production costs. In addition, the apparatus can collect a large amount of by-products quickly and efficiently over a long period of time. As a result, the efficiency of collecting various kinds of by-products discharged in semiconductor manufacturing, and the productivity and reliability of semiconductor manufacturing can be greatly improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for collecting a by-product in a semiconductor process, the apparatus provided on a line between a process chamber and a vacuum pump to collect a by-product in an exhaust gas, which is produced in the process chamber, the apparatus comprising:
   a housing provided with a gas inlet and a gas outlet respectively provided on an upper plate and a lower plate, which are detachably coupled to upper and lower openings respectively, and configured with a passage through which gas exhausted from the process chamber flows;
   a heater plate provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the energy evenly inside the housing;
   a heater power supply unit supplying a power to the heater plate;
   a first upper horizontal bracket having multiple by-product collecting members, which are fixed on an upper surface of a quadrangular plate having a vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form;
   a second upper horizontal bracket having multiple minute gas passing holes, which have a relatively small diameter and is formed at an outer perimeter of a vertical mass gas passing opening formed at the center thereof, disposed spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form;
   a by-product collecting tower having a structure in which multiple first and second directional vertical plates having multiple horizontal gas passing holes are assembled in a lattice form in a manner that intersects each other in a direction of 90 degree angles, disposed between the second upper horizontal bracket and a lower horizontal bracket to allow the exhaust gas introduced through the second upper horizontal bracket in the vertical direction or introduced through the inner space of the housing in a lateral direction to pass in the vertical direction and collecting a part of the by-product in a powder form;
   the lower horizontal bracket having multiple gas holes spaced a predetermined distance apart from each other, provided fixedly below a lower surface of the by-product collecting tower in the horizontal direction, guiding the exhaust gas vertically introduced through the by-product collecting tower toward a window, and collecting a part of the by-product contained in the exhaust gas in a powder form;
   the window having a structure in which five rectangular plates having multiple gas suction holes are assembled into a rectangular shape with a bottom surface opened, configured in which the window is provided fixedly to be spaced a predetermined distance from the bottom of the lower horizontal bracket and in which a bottom surface thereof is spaced a predetermined distance apart from an upper surface of the lower plate of the housing by the multiple supporters, and blocking the by-product that passes through the by-product collecting tower and the lower horizontal bracket or flows in the lateral direction through the inner space of the housing and then is converted into the powder form from directly introducing toward a gas collecting and discharging port and guiding only the exhaust gas toward the gas collecting and discharging port; and
   the gas collecting and discharging port provided at an upper portion thereof with an exhaust gas suction opening having "+" shape which is opened in four directions, disposed vertically between the inside of the window and a gas discharge opening provided on the lower plate of the housing, and collecting the exhaust gas introduced from upper, front, rear, and sides through the gas suction holes of the window and through the bottom of the window, which is opened, to discharge the exhaust gas outside,
   wherein, among the multiple first and second directional vertical plates constituting the by-product collecting tower, first and second directional vertical plates located on the inner side are configured to have heights approximately ½ or ⅓ of those located on the outer side of the four sides such that a powder collecting portion having a volume of ½ or ⅓ of a total internal volume is formed in an upper portion of the inside of the by-product collecting tower.

2. An apparatus for collecting a by-product in a semiconductor process, the apparatus provided on a line between a process chamber and a vacuum pump to collect a by-product in an exhaust gas, which is produced in the process chamber, the apparatus comprising:

a housing provided with a gas inlet and a gas outlet respectively provided on an upper plate and a lower plate, which are detachably coupled to upper and lower openings respectively, and configured with a passage through which gas exhausted from the process chamber flows;

a heater plate provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the energy evenly inside the housing;

a heater power supply unit supplying a power to the heater plate;

a first upper horizontal bracket having multiple by-product collecting members, which are fixed on an upper surface of a quadrangular plate having a vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form;

a second upper horizontal bracket having multiple minute gas passing holes, which have a relatively small diameter and is formed at an outer perimeter of a vertical mass gas passing opening formed at the center thereof, disposed spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form;

a by-product collecting tower having a rectangular tower shape whose four sides are stepped in which multiple first and second directional vertical plates having multiple horizontal gas passing holes and cut at different heights are assembled in a lattice form, disposed between the second upper horizontal bracket and a lower horizontal bracket, allowing a part of the exhaust gas introduced through the second upper horizontal bracket to pass in the vertical direction and allowing the remaining exhaust gas to flow on the four sides in stepped manner or flow slantingly along the four sides, and collecting a part of the by-product in a powder form;

the lower horizontal bracket having multiple gas holes spaced a predetermined distance apart from each other, provided fixedly below a lower surface of the by-product collecting tower in the horizontal direction, guiding the exhaust gas vertically introduced through the by-product collecting tower toward a window, and collecting a part of the by-product contained in the exhaust gas in a powder form;

the window having a structure in which five rectangular plates having multiple gas suction holes are assembled into a rectangular shape with a bottom surface opened, configured in which the window is provided fixedly to be spaced a predetermined distance from the bottom of the lower horizontal bracket and in which a bottom surface thereof is spaced a predetermined distance apart from an upper surface of the lower plate of the housing by the multiple supporters, and blocking the by-product that passes through the by-product collecting tower and the lower horizontal bracket or flows in the lateral direction through the inner space of the housing and then is converted into the powder form from directly introducing toward a gas collecting and discharging port and guiding only the exhaust gas toward the gas collecting and discharging port; and the gas collecting and discharging port provided at an upper portion thereof with an exhaust gas suction opening having "+" shape which is opened in four directions, disposed vertically between the inside of the window and a gas discharge opening provided on the lower plate of the housing, and collecting the exhaust gas introduced from upper, front, rear, and sides through the gas suction holes of the window and through the bottom of the window, which is opened, to discharge the exhaust gas outside, wherein, among the multiple first and second directional vertical plates constituting the by-product collecting tower, first and second directional vertical plates located on the inner side are configured to have heights approximately ½ or ⅓ of those located on the outer side of the four sides such that a powder collecting portion having a volume of ½ or ⅓ of a total internal volume is formed in an upper portion of the inside of the by-product collecting tower.

3. The apparatus of claim 1, further comprising:
multiple minute gas passing holes, which have a diameter smaller than that of the vertical mass gas passing opening provided on the center of the quadrangular plate, on the quadrangular plate of the first upper horizontal bracket such that a part of the exhaust gas flowing horizontally along the upper surface of the quadrangular plate of the first upper horizontal bracket flows toward the second upper horizontal bracket and the by-product collecting tower through the multiple minute gas passing holes.

4. The apparatus of claim 1, wherein the by-product collecting members disposed on an upper surface of the first upper horizontal bracket include:
multiple gas flow guiding plates radially arranged in a vertically erected state; and
multiple by-product collecting plates crossed at right angles to the gas flow guide plates while being spaced at a predetermined distance from one another.

5. The apparatus of claim 1, further comprising:
an inclined exhaust gas guiding pipe inclined downwardly at a predetermined angle at an end of the exhaust gas suction opening disposed to face four surfaces of the housing in order to suck, collect, and discharge the exhaust gas passing through the window and the exhaust gas guided to a lower portion of the housing.

6. The apparatus of claim 5, wherein the predetermined inclined angle of the inclined exhaust gas guiding pipe is in a range of 10 degree angles to 20 degree angles.

7. The apparatus of claim 1, further comprising:
a cooling pipe through which a coolant flows embedded inside the upper plate of the housing; and
a coolant inlet and a coolant outlet connected to both ends of the cooling pipe respectively and provided on an upper surface of the upper plate the upper plate is prevented from being overheated due to heat produced from the heater plate, whereby a sealing or a gasket provided between upper surface of the housing and the bottom surface of the upper plate is prevented from being damaged and the by-product powder is collected on the bottom surface of the upper plate.

8. The apparatus of claim 1, further comprising:
multiple vortex generating plates installed at a predetermined height from an inner wall of the housing in the vertical direction in order to allow the exhaust gas passing through the inside of the housing to vortex,
wherein the vortex generating plates are formed to have a side cross-sectional surface among shapes of "-", "  ", "  ", "  ", and "  ".

9. The apparatus of claim 1, further comprising:
multiple legs each having a height adjusting bolt/support and provided at a lower end of the bottom surface of the lower plate of the housing in the vertical direction.

10. The apparatus of claim 1, further comprising:
multiple housing deformation preventing rings provided on an outer surface of the housing while keeping a predetermined distance to each other on the vertical direction, in order to prevent the shape of the housing having a predetermined volume from being deformed by a suction force generated in operation of the vacuum pump.

11. The apparatus of claim 1, further comprising:
a pair of handles on front and rear sides, or both sides of the housing.

12. The apparatus of claim 2, further comprising:
multiple minute gas passing holes, which have a diameter smaller than that of the vertical mass gas passing opening provided on the center of the quadrangular plate, on the quadrangular plate of the first upper horizontal bracket such that a part of the exhaust gas flowing horizontally along the upper surface of the quadrangular plate of the first upper horizontal bracket flows toward the second upper horizontal bracket and the by-product collecting tower through the multiple minute gas passing holes.

13. The apparatus of claim 2, wherein the by-product collecting members disposed on an upper surface of the first upper horizontal bracket include:
multiple gas flow guiding plates radially arranged in a vertically erected state; and
multiple by-product collecting plates crossed at right angles to the gas flow guide plates while being spaced at a predetermined distance from one another.

14. The apparatus of claim 2, further comprising:
an inclined exhaust gas guiding pipe inclined downwardly at a predetermined angle at an end of the exhaust gas suction opening disposed to face four surfaces of the housing in order to suck, collect, and discharge the exhaust gas passing through the window and the exhaust gas guided to a lower portion of the housing.

15. The apparatus of claim 14, wherein the predetermined inclined angle of the inclined exhaust gas guiding pipe is in a range of 10 degree angles to 20 degree angles.

16. The apparatus of claim 2, further comprising:
a cooling pipe through which a coolant flows embedded inside the upper plate of the housing; and
a coolant inlet and a coolant outlet connected to both ends of the cooling pipe respectively and provided on an upper surface of the upper plate the upper plate is prevented from being overheated due to heat produced from the heater plate, whereby a sealing or a gasket provided between upper surface of the housing and the bottom surface of the upper plate is prevented from being damaged and the by-product powder is collected on the bottom surface of the upper plate.

17. The apparatus of claim 2, further comprising:
multiple vortex generating plates installed at a predetermined height from an inner wall of the housing in the vertical direction in order to allow the exhaust gas passing through the inside of the housing to vortex,
wherein the vortex generating plates are formed to have a side cross-sectional surface among shapes of "-", "  ", " 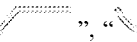 ", " 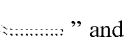 " and "  ".

18. The apparatus of claim 2, further comprising:
multiple legs each having a height adjusting bolt/support and provided at a lower end of the bottom surface of the lower plate of the housing in the vertical direction.

19. The apparatus of claim 2, further comprising:
multiple housing deformation preventing rings provided on an outer surface of the housing while keeping a predetermined distance to each other on the vertical direction, in order to prevent the shape of the housing having a predetermined volume from being deformed by a suction force generated in operation of the vacuum pump.

20. The apparatus of claim 2, further comprising:
a pair of handles on front and rear sides, or both sides of the housing.

* * * * *